(12) United States Patent
Adachi et al.

(10) Patent No.: US 8,803,936 B2
(45) Date of Patent: Aug. 12, 2014

(54) OPTICAL DEVICE CAPABLE OF MINIMIZING OUTPUT VARIATION DUE TO FEEDBACK LIGHT, OPTICAL SCANNING APPARATUS, AND IMAGE FORMING APPARATUS

(75) Inventors: Kazuhiko Adachi, Miyagi (JP); Shunichi Sato, Miyagi (JP); Satoru Sugawara, Miyagi (JP); Toshihiro Ishii, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 64 days.

(21) Appl. No.: 13/505,516

(22) PCT Filed: Dec. 15, 2010

(86) PCT No.: PCT/JP2010/073064
§ 371 (c)(1),
(2), (4) Date: May 2, 2012

(87) PCT Pub. No.: WO2011/078196
PCT Pub. Date: Jun. 30, 2011

(65) Prior Publication Data
US 2012/0251182 A1  Oct. 4, 2012

(30) Foreign Application Priority Data

Dec. 21, 2009  (JP) ................................ 2009-288626
Oct. 27, 2010  (JP) ................................ 2010-240266

(51) Int. Cl.
*B41J 2/385* (2006.01)
*B41J 2/41* (2006.01)
*B41J 2/45* (2006.01)
*B41J 15/14* (2006.01)
*B41J 27/00* (2006.01)
*B41J 2/435* (2006.01)
*B41J 2/47* (2006.01)
*B41J 2/455* (2006.01)

(52) U.S. Cl.
CPC .. *B41J 2/45* (2013.01); *B41J 2/473* (2013.01); *B41J 2/455* (2013.01)
USPC ........... 347/238; 347/130; 347/134; 347/138; 347/152; 347/242; 347/257; 347/263

(58) Field of Classification Search
CPC .............. B41J 2/471; B41J 2/473; B41J 2/45; B41J 2/455
USPC ......... 347/130, 134, 138, 152, 238, 242, 257, 347/263
See application file for complete search history.

(56) References Cited

U.S. PATENT DOCUMENTS

| | | |
|---|---|---|
| 5,923,691 A | 7/1999 | Sato |
| 5,939,733 A | 8/1999 | Sato |
| 6,002,700 A | 12/1999 | Sato |
| 6,061,371 A * | 5/2000 | Uejima et al. ................... 372/31 |
| 6,072,196 A | 6/2000 | Sato |
| 6,207,973 B1 | 3/2001 | Sato et al. |
| 6,233,264 B1 | 5/2001 | Sato |
| 6,542,528 B1 | 4/2003 | Sato et al. |
| 6,563,851 B1 | 5/2003 | Jikutani et al. |
| 6,567,435 B1 * | 5/2003 | Scott et al. ............... 372/29.021 |
| 6,614,821 B1 | 9/2003 | Jikutani et al. |
| 6,639,931 B1 | 10/2003 | Dowd et al. |
| 6,674,785 B2 | 1/2004 | Sato et al. |
| 6,765,232 B2 | 7/2004 | Takahashi et al. |
| 6,803,604 B2 | 10/2004 | Takahashi et al. |
| 6,927,412 B2 | 8/2005 | Takahashi et al. |
| 6,959,025 B2 | 10/2005 | Jikutani et al. |
| 6,975,663 B2 | 12/2005 | Sekiya et al. |
| 7,002,527 B2 | 2/2006 | Sugawara |
| 7,684,458 B2 | 3/2010 | Sato et al. |
| 7,693,204 B2 | 4/2010 | Sato et al. |
| 7,720,125 B2 | 5/2010 | Jikutani et al. |
| 7,729,400 B2 | 6/2010 | Tanaka et al. |
| 7,746,912 B2 | 6/2010 | Motomura et al. |
| 7,957,444 B2 | 6/2011 | Itoh et al. |
| 7,978,739 B2 | 7/2011 | Sugawara et al. |
| 7,981,700 B2 | 7/2011 | Sato et al. |
| 8,035,676 B2 | 10/2011 | Harasaka et al. |
| 8,111,725 B2 | 2/2012 | Ishii et al. |
| 2003/0053501 A1 | 3/2003 | Sekiya et al. |
| 2004/0091011 A1 | 5/2004 | Liu |
| 2004/0264884 A1 * | 12/2004 | Liu ................................ 385/89 |

| | | | |
|---|---|---|---|
| 2006/0093010 | A1 | 5/2006 | Sekiya et al. |
| 2007/0014324 | A1* | 1/2007 | Maeda et al. ............. 372/46.01 |
| 2007/0030874 | A1 | 2/2007 | Ariga et al. |
| 2008/0043796 | A1 | 2/2008 | Jikutani et al. |
| 2008/0055672 | A1 | 3/2008 | Watanabe et al. |
| 2008/0234560 | A1 | 9/2008 | Nomoto et al. |
| 2009/0195849 | A1* | 8/2009 | Ichii et al. ................. 359/204.1 |
| 2009/0295902 | A1 | 12/2009 | Sato et al. |
| 2009/0297099 | A1* | 12/2009 | Benjamin et al. ............... 385/32 |
| 2009/0303308 | A1* | 12/2009 | Itoh et al. ...................... 347/256 |
| 2010/0189467 | A1 | 7/2010 | Sato et al. |
| 2010/0214633 | A1 | 8/2010 | Sato et al. |
| 2010/0328747 | A1 | 12/2010 | Jikutani et al. |
| 2011/0037825 | A1 | 2/2011 | Jikutani et al. |
| 2012/0069416 | A1 | 3/2012 | Sato et al. |

FOREIGN PATENT DOCUMENTS

| | | | |
|---|---|---|---|
| JP | 8-148755 | | 6/1996 |
| JP | 2000-22271 | | 1/2000 |
| JP | 2001-156395 | | 6/2001 |
| JP | 2002-323646 | | 11/2002 |
| JP | 2004-289033 | | 10/2004 |
| JP | 2005-86027 | | 3/2005 |
| JP | 2005-252032 | | 9/2005 |
| JP | 2007-103576 | | 4/2007 |
| JP | 3955925 | | 5/2007 |
| JP | 2007-201398 | | 8/2007 |
| JP | 2008-16824 | | 1/2008 |
| JP | 4085970 | | 2/2008 |
| JP | 2008-124287 | | 5/2008 |
| JP | 2008-192780 | | 8/2008 |
| JP | 2008192780 | A * | 8/2008 |
| JP | 2008-229239 | | 10/2008 |
| JP | 4411040 | | 11/2009 |

OTHER PUBLICATIONS

International Search Report and Written Opinion in PCT/JP2010/073064.

Korean official action dated Aug. 23, 2013 and English translation in connection with corresponding Korean patent application.

\* cited by examiner

*Primary Examiner* — Alessandro Amari

*Assistant Examiner* — Kendrick Liu

(74) *Attorney, Agent, or Firm* — Cooper & Dunham LLP

(57) ABSTRACT

An optical device includes a surface-emitting laser array having a plurality of light-emitting portions; a package member on which the surface-emitting laser array is disposed; and a transparent member retained on the package member and disposed on an optical path of a light beam emitted by the surface-emitting laser array. The transparent member includes an incident plane on which the light beam emitted by the surface-emitting laser array is incident. The incident plane is inclined with respect to an emitting surface of the surface-emitting laser array at a first inclination angle which is smaller than a second inclination angle at which the light emitted by one of the light-emitting portions is incident on another, most-distant one, of the light-emitting portions via reflection by the transparent member.

14 Claims, 33 Drawing Sheets

FIG.7
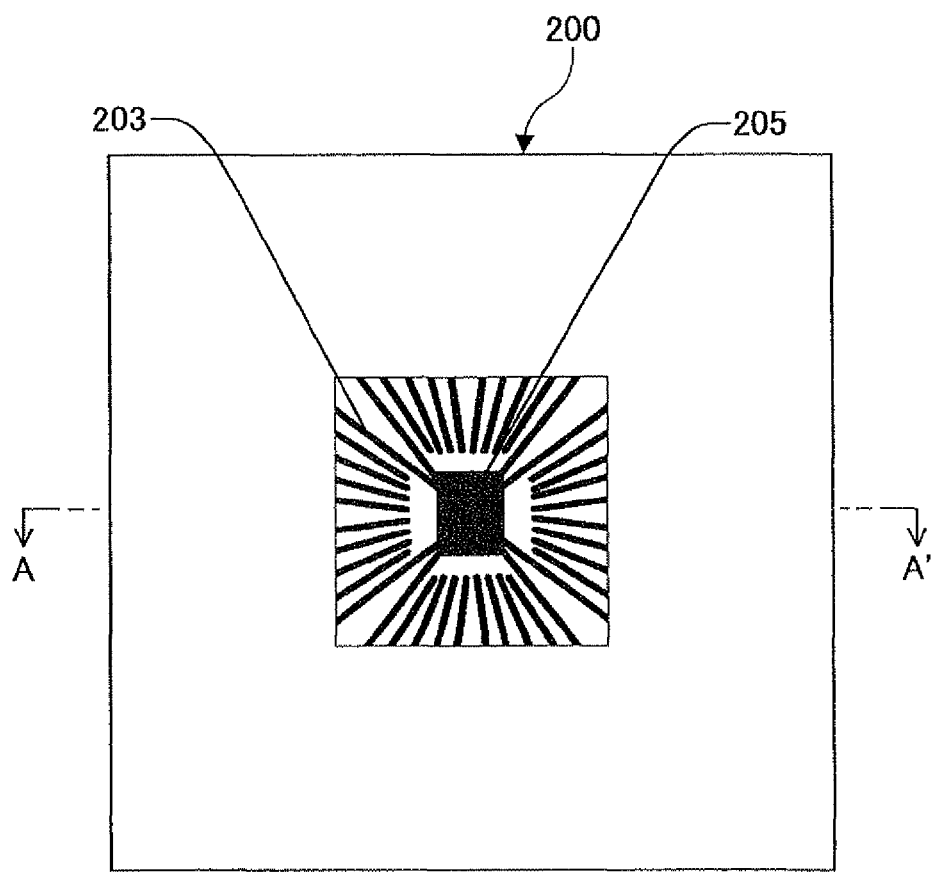
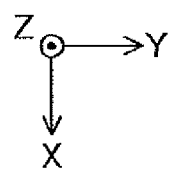

OPTICAL DEVICE CAPABLE OF MINIMIZING OUTPUT VARIATION DUE TO FEEDBACK LIGHT, OPTICAL SCANNING APPARATUS, AND IMAGE FORMING APPARATUS

TECHNICAL FIELD

The present invention generally relates to optical devices, optical scanning apparatuses, and image forming apparatuses. More particularly, the invention relates to an optical device that emits light, an optical scanning apparatus having the optical device, and an image forming apparatus having the optical scanning apparatus.

BACKGROUND ART

A surface-emitting laser, such as a vertical cavity surface emitting laser (VCSEL) is a semiconductor laser that emits light in a direction perpendicular to a substrate. Compared to an edge-emitting semiconductor laser, the surface emitting laser is low-cost and high-performance, and can be easily implemented in an array. Thus, there is a growing expectation that the surface emitting laser will provide light sources for optical communications technologies, such as for optical interconnections, optical pick-ups, and image forming apparatus such as laser printers. Vigorous research and development of the surface emitting laser technology is underway, and some of the technology has already been put to practical use.

In recent years, a surface-emitting laser element has been proposed in which an optically transparent dielectric film is formed on an emitting surface, and a high-order transverse mode is controlled by providing a difference in reflectivity between a central portion and a peripheral portion of the emitting surface. Another surface-emitting laser element has also been proposed in which the polarization direction is further stabilized by providing shape anisotropy in such a dielectric film (see Patent Documents 1 through 4).

Generally, when a laser element that emits laser light is used with an optical system, light reflected by a lens or glass surface in the optical system may become incident on the laser element as feedback light, thereby varying the amount of emitted laser light. Thus, laser elements resistant to such feedback light have been proposed. For example, Patent Document 5 discusses a surface-emitting laser element in which a resonator is formed by a lower multilayer mirror and an upper multilayer mirror, where the relaxation oscillation frequency at a bias point in the resonator is set above an optical communication frequency for modulating the laser light emitted by the surface-emitting laser element.

Patent Document 6 discusses a surface-emitting semiconductor laser comprising a semiconductor substrate. An active layer is disposed on top of the semiconductor substrate, and an emitting plane disposed on top of the active layer is configured to emit the laser light produced in the active layer in a vertical direction with respect to the semiconductor substrate. An absorption layer is disposed on top of the emitting plane and configured to absorb some of the laser light.

It has also been proposed to control the feedback light itself. For example, Patent Document 7 discusses a surface-emitting laser module for optical transmission comprising a TO header on which at least a surface-emitting laser chip and a monitoring photodetector are mounted. The module includes a cap with a window coated with a film having a transmittance of 40% or less.

However, in the surface-emitting laser element according to Patent Document 5, the structure of a drive circuit as well as the element itself is complex, resulting in increased cost. The surface-emitting semiconductor laser according to Patent Document 6 also has a complex element structure and cannot provide sufficient effects. When the surface-emitting laser module according to Patent Document 7 is applied to a surface-emitting laser array, the angle of inclination of the window glass needs to be increased, making it difficult to process the cap and also resulting in an increase in size.

Patent Document 1: JP 2001-156395A
Patent Document 2: JP Patent No. 3955925
Patent Document 3: JP 2007-201398A
Patent Document 4: JP 2004-289033A
Patent Document 5: JP 2005-252032A
Patent Document 6: JP 2005-086027A
Patent Document 7: JP 2007-103576A

SUMMARY OF THE INVENTION

In one aspect, the invention provides an optical device that includes a surface-emitting laser array having a plurality of light-emitting portions; a package member on which the surface-emitting laser array is disposed; and a transparent member retained on the package member and disposed on an optical path of a light beam emitted by the surface-emitting laser array. The transparent member includes an incident plane on which the light beam emitted by the surface-emitting laser array is incident. The incident plane of the transparent member is inclined with respect to an emitting surface of the surface-emitting laser array at a first inclination angle which is smaller than a second inclination angle at which the light emitted by one of the light-emitting portions is incident on another of the light-emitting portions via reflection by the transparent member. The one and the other light emitting portions are spaced apart from each other by the greatest distance among the light emitting portions of the surface-emitting laser array.

In another aspect, the invention provides an optical scanning apparatus that includes a light source including the optical device; a deflector configured to deflect the light emitted by the light source; and a scanning optical system configured to collect the light deflected by the deflector on a scanned surface.

In another aspect, the invention provides an image forming apparatus that includes an image carrier; and the optical scanning apparatus configured to scan the image carrier with light having image information.

BRIEF DESCRIPTION OF THE DRAWINGS

FIG. 7 is a plan view of a package member of the optical device;

BEST MODE OF CARRYING OUT THE INVENTION

Figure 1:
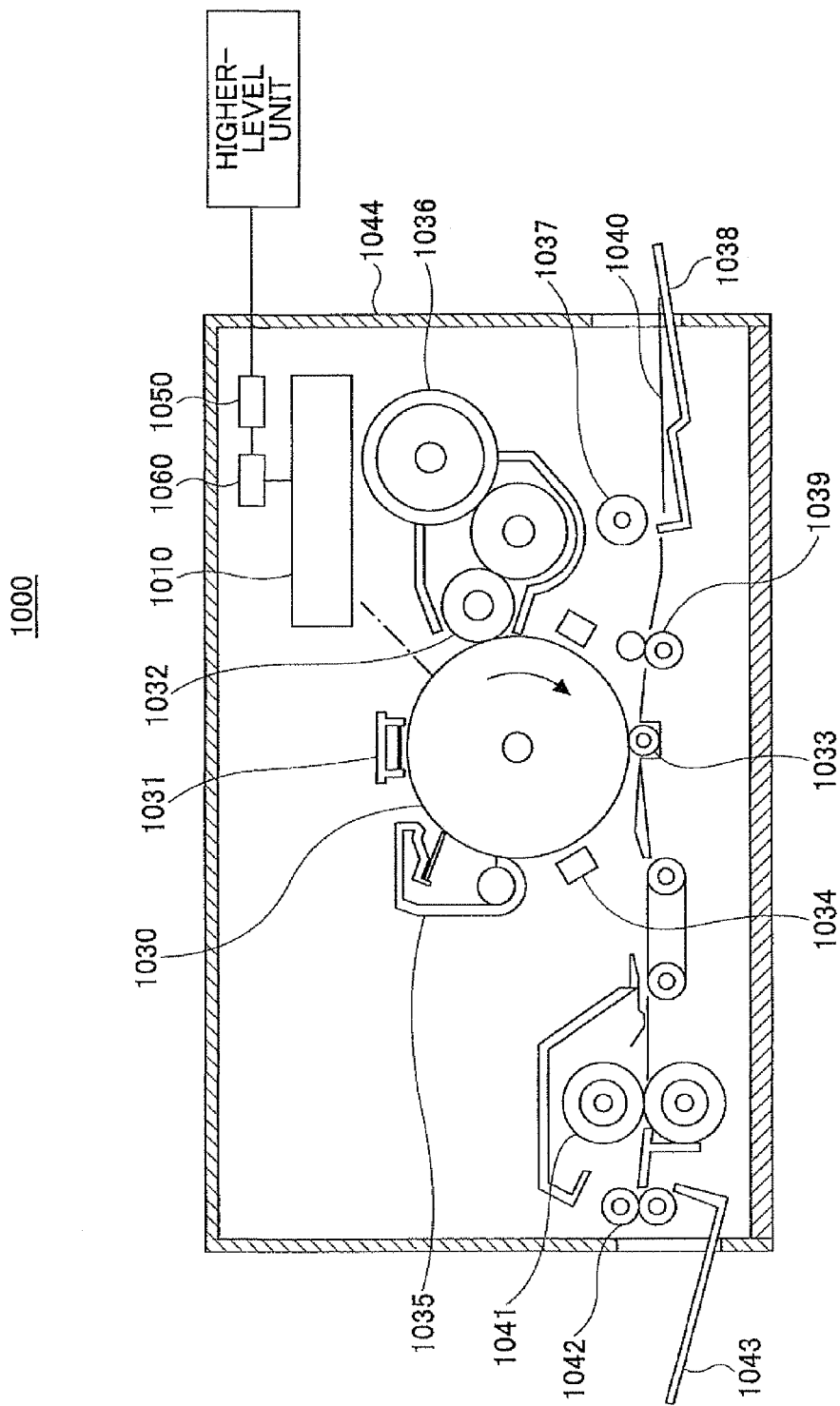
FIG. 1 illustrates a laser printer according to an embodiment of the present invention.

FIG. 1 illustrates a laser printer 1000 according to an embodiment of the present invention. The laser printer 1000 includes an optical scanning apparatus 1010; a photosensitive drum 1030; a charging unit 1031; a developing roller 1032; a transfer charger 1033; a neutralizing unit 1034; a cleaning unit 1035; a toner cartridge 1036; a sheet-feeding roller 1037; a sheet-feeding tray 1038; a registration roller pair 1039; a fusing roller 1041; a sheet-ejecting roller 1042; an ejected sheet tray 1043; a communication control unit 1050; and a printer control unit 1060 for centrally controlling the above units. These units are disposed within a printer housing 1044.

The communication control unit 1050 is configured to control bidirectional communications with a higher-level apparatus (such as a personal computer) via a network, for example. The photosensitive drum 1030 is a cylindrical component on a surface of which a photosensitive layer is formed. The photosensitive drum 1030 is configured to be rotated in a direction indicated by an arrow in FIG. 1.

The charging unit 1031, the developing roller 1032, the transfer charger 1033, the neutralizing unit 1034, and the cleaning unit 1035 are disposed around the photosensitive drum 1030 in an order corresponding to the steps of an image forming process in the laser printer 1000. Specifically, the charging unit 1031 charges the surface of the photosensitive drum 1030 uniformly. The charged surface of the photosensitive drum 1030 is scanned with a light beam emitted by the optical scanning apparatus 1010. The light beam is modulated by image information supplied from the higher-level apparatus. As a result, a latent image is formed on the surface of the photosensitive drum 1030 that corresponds to the image information. The latent image is transported in the direction of the developing roller 1032 as the photosensitive drum 1030 is rotated. The structure of the optical scanning apparatus 1010 is described in detail later.

The toner cartridge 1036 stores toner that is supplied to the developing roller 1032. The developing roller 1032 causes the toner to be attached to the latent image on the surface of the photosensitive drum 1030 in order to develop (i.e., make visible) the image information. The developed image (which may be referred to as a "toner image") is transported in the direction of the transfer charger 1033 as the photosensitive drum 1030 is rotated.

The sheet-feeding tray 1038 stores a number of recording sheets 1040. The sheet-feeding roller 1037 picks out one of the recording sheets 1040 from the sheet-feeding tray 1038 and delivers the recording sheet 1040 to the registration roller pair 1039. The registration roller pair 1039 first retains the recording sheet 1040 and then sends it out into a gap between the photosensitive drum 1030 and the transfer charger 1033 in accordance with the rotation of the photosensitive drum 1030.

The transfer charger 1033 is provided with a voltage of an opposite polarity to the polarity of the toner so that the toner on the surface of the photosensitive drum 1030 can be electrically drawn toward the recording sheet 1040. After the toner image is transferred onto the recording sheet 1040, the recording sheet 1040 is transported to the fusing roller 1041. The fusing roller 1041 applies heat and pressure onto the recording sheet 1040 so as to fuse the toner image onto the recording sheet 1040. The recording sheet 1040 is then transported via the sheet-ejecting roller 1042 to the ejected sheet tray 1043. The surface of the photosensitive drum 1030 is thereafter neutralized by the neutralizing unit 1034. The toner that remains on the surface of the photosensitive drum 1030 is removed by the cleaning unit 1035 before the thus cleaned surface of the photosensitive drum 1030 returns to the position opposite the charging unit 1031.

Figure 2:
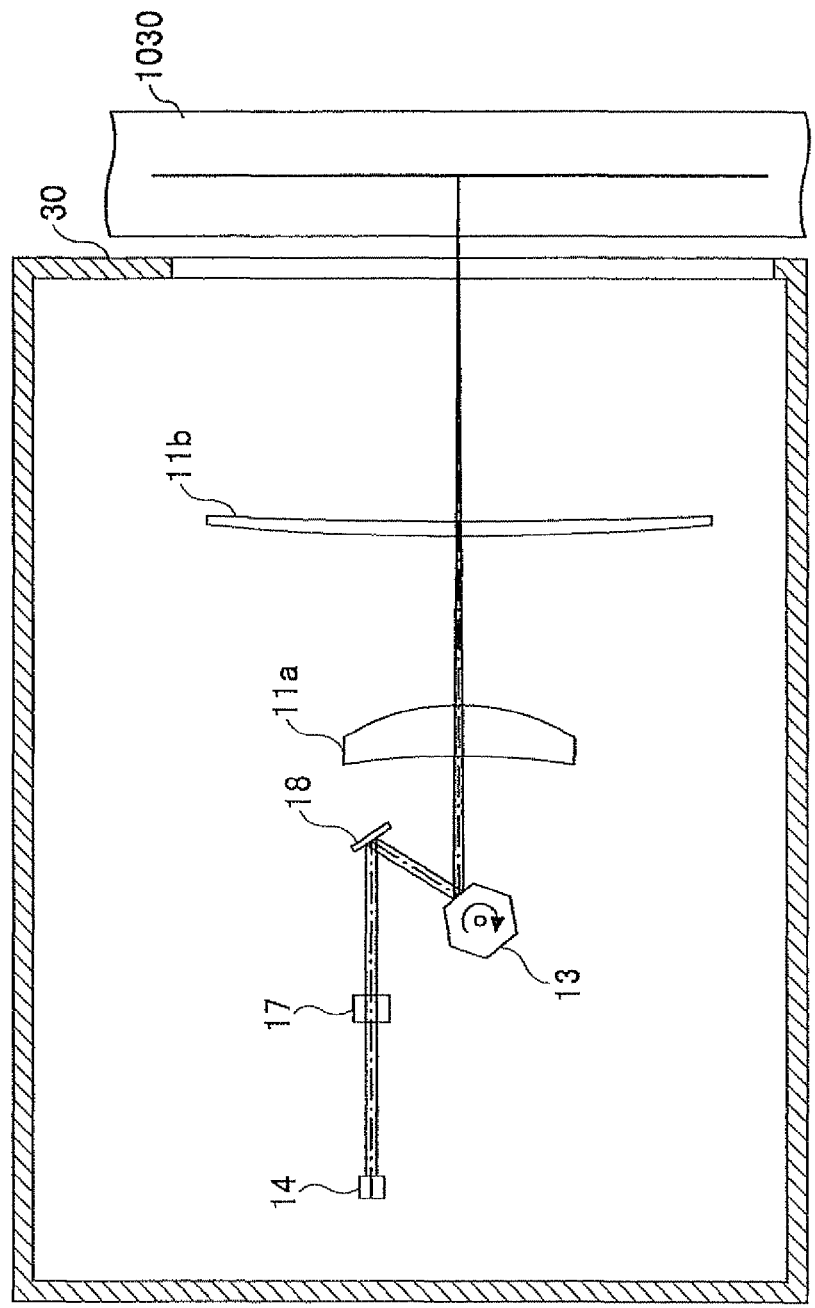
FIG. 2 illustrates an optical scanning apparatus of the laser printer of FIG. 1.

FIG. 2 illustrates the optical scanning apparatus 1010. The optical scanning apparatus 1010 includes a deflector-side scanning lens 11a; an image-side scanning lens 11b; a polygon mirror 13; a light-source unit 14; a cylindrical lens 17; a reflecting mirror 18; and a scan control unit (not shown). These units are disposed within an optical housing 30. In the present disclosure, a direction in which light is emitted from the light-source unit 14 is referred to as a Z-axis direction, and directions perpendicular to each other in a plane normal to the Z-axis direction are referred to as an "X-axis" direction and a "Y-axis" direction.

Figure 3:
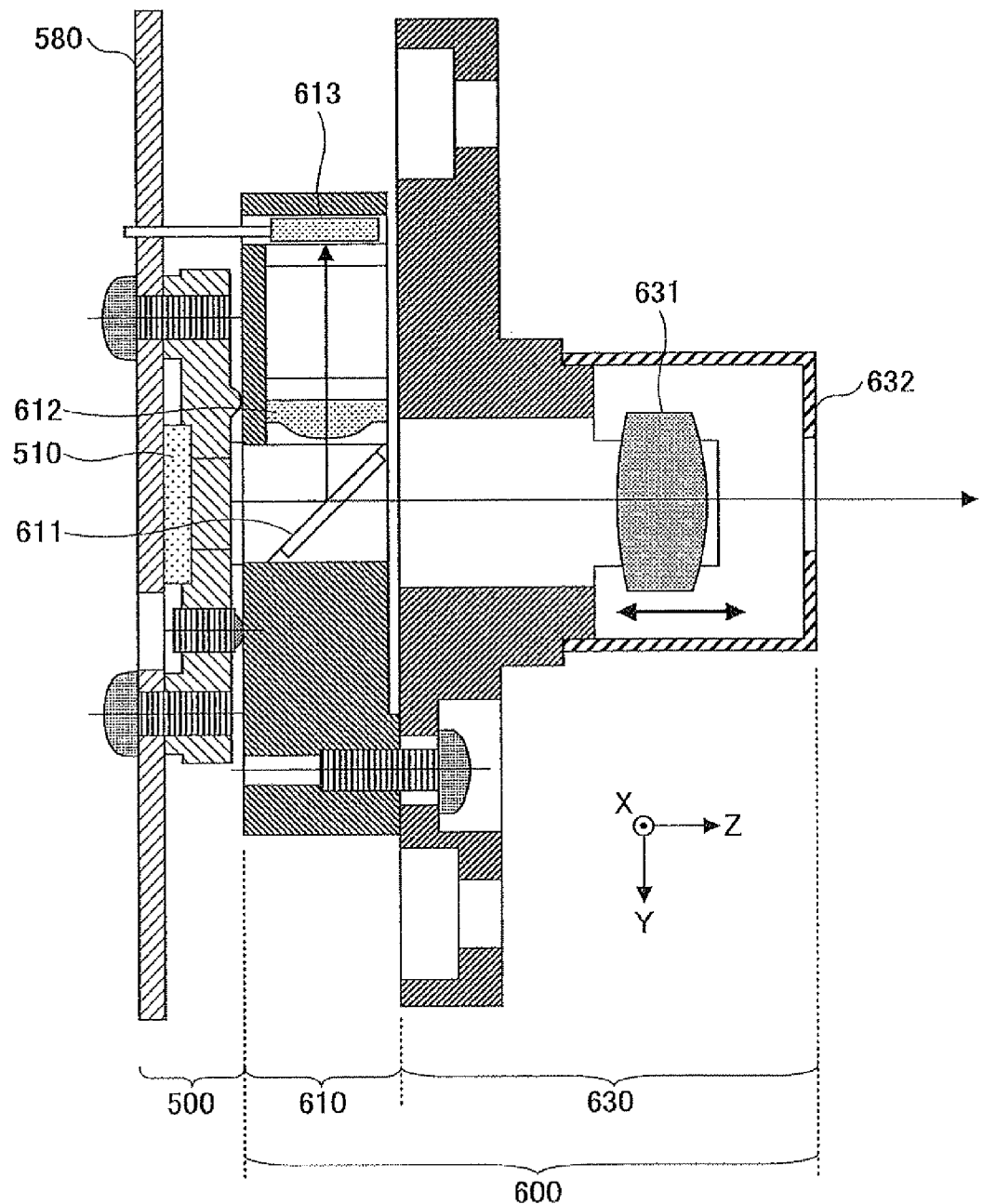
FIG. 3 illustrates a light-source unit of the optical scanning apparatus of FIG. 2.

FIG. 3 illustrates the light-source unit 14, which includes a laser module 500 and an optical module 600. The laser module 500 has a printed circuit board (PCB) 580 on which an optical device 510 and a laser control unit (not shown) for controlling the optical device 510 are mounted. The optical module 600 includes a first optical module portion 610 and a second optical module portion 630. The first optical module portion 610 has a half mirror 611; a focusing lens 612; and a light-receiving element 613. The second optical module portion 630 has a coupling lens 631 and an aperture plate 632.

The first optical module portion 610 is disposed on the +Z side of the optical device 510 such that the half mirror 611 is positioned on an optical path of the light emitted by the optical device 510. Some of the light incident on the half mirror 611 is reflected in the −Y direction and received by the light-receiving element 613 via the focusing lens 612. The light-receiving element 613 outputs a signal (photo-electrically converted signal) indicating the amount of received light to the laser control unit on the laser module 500.

The second optical module portion 630 is disposed on the +Z side of the first optical module portion 610 such that the coupling lens 631 is positioned on an optical path of the light that has passed through the half mirror 611. The coupling lens 631 is configured to make parallel light out of the light that has passed through the half mirror 611. The aperture plate 632 has an aperture for shaping the light that has passed through the coupling lens 631 before the light is emitted from the light-source unit 14.

Referring back to FIG. 2, the cylindrical lens 17 is configured to collect the light emitted by the light-source unit 14 near a deflecting/reflecting surface of the polygon mirror 13 via the reflecting mirror 18. The optical system disposed on the optical path between the optical device 510 and the polygon mirror 13 may be referred to as a "pre-deflector optical system". In accordance with the present embodiment, the pre-deflector optical system includes the coupling lens 631, the aperture plate 632, the cylindrical lens 17, and the reflecting mirror 18.

The polygon mirror 13 comprises a regular hexagonal column with a reduced height on the sides of which six deflecting/reflecting surfaces are formed. The polygon mirror 13 is rotated by a rotating mechanism (not shown) in a direction indicated by an arrow in FIG. 2 at a constant angular velocity. Thus, the light collected by the cylindrical lens 17 near the deflecting/reflecting surfaces of the polygon mirror 13 is deflected at the constant angular velocity by the polygon mirror 13.

The deflector-side scanning lens 11a is disposed on an optical path of the light deflected by the polygon mirror 13. The image-side scanning lens 11b is disposed on an optical path of the light that has passed through the deflector-side scanning lens 11a. The light that has passed through the image-side scanning lens 11b irradiates the surface of the photosensitive drum 1030, forming a light spot thereon. The light spot is moved in a longitudinal direction of the photosensitive drum 1030 as the polygon mirror 13 rotates, thus scanning the surface of the photosensitive drum 1030 in a main-scan direction. The direction of rotation of the photosensitive drum 1030 is referred to as a "sub-scan direction".

The optical system disposed on an optical path between the polygon mirror 13 and the photosensitive drum 1030 may be referred to as a scanning optical system. In accordance with the present embodiment, the scanning optical system includes the deflector-side scanning lens 11a and the image-side scanning lens 11b. At least one folding mirror may be disposed on the optical path between the deflector-side scanning lens 11a and the image-side scanning lens 11b, or on the optical path between the image-side scanning lens 11b and the photosensitive drum 1030.

Figure 4:
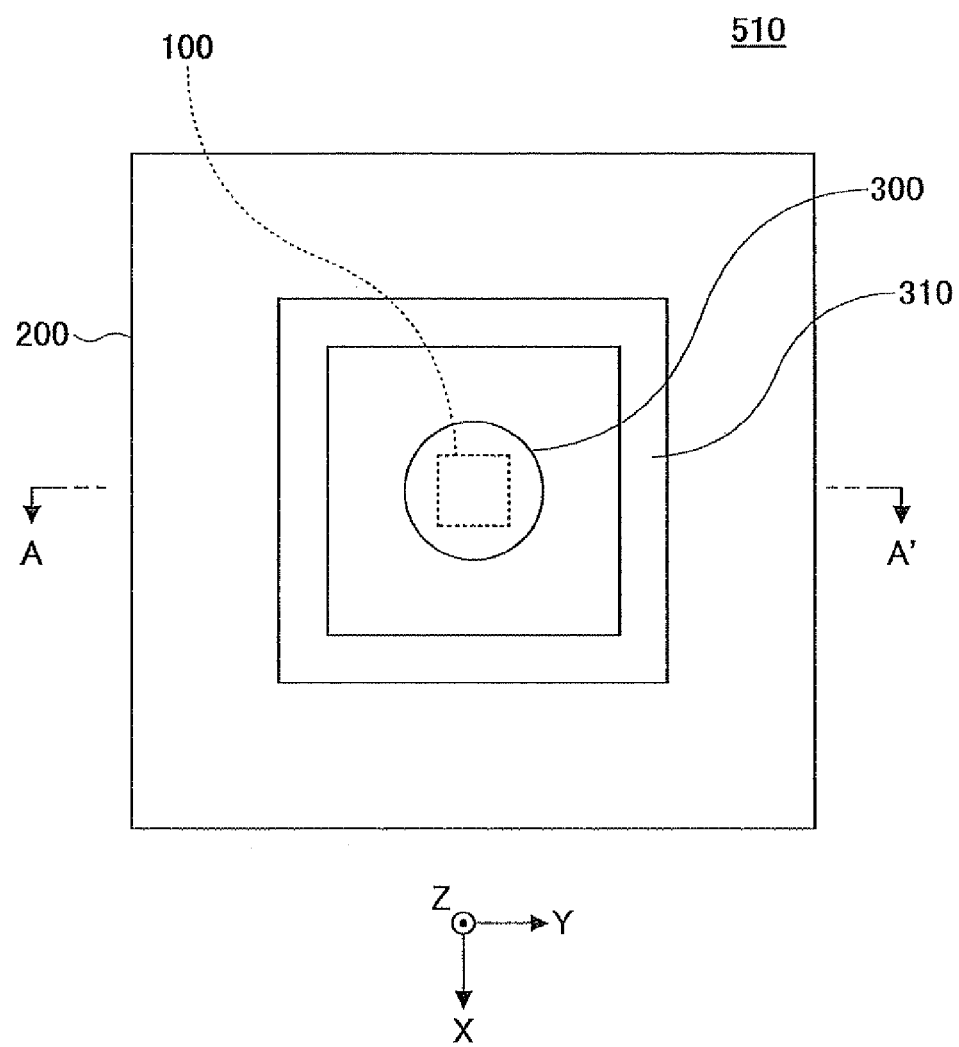
FIG. 4 is a plan view of an optical device of the light-source unit of FIG. 3.
Figure 5:
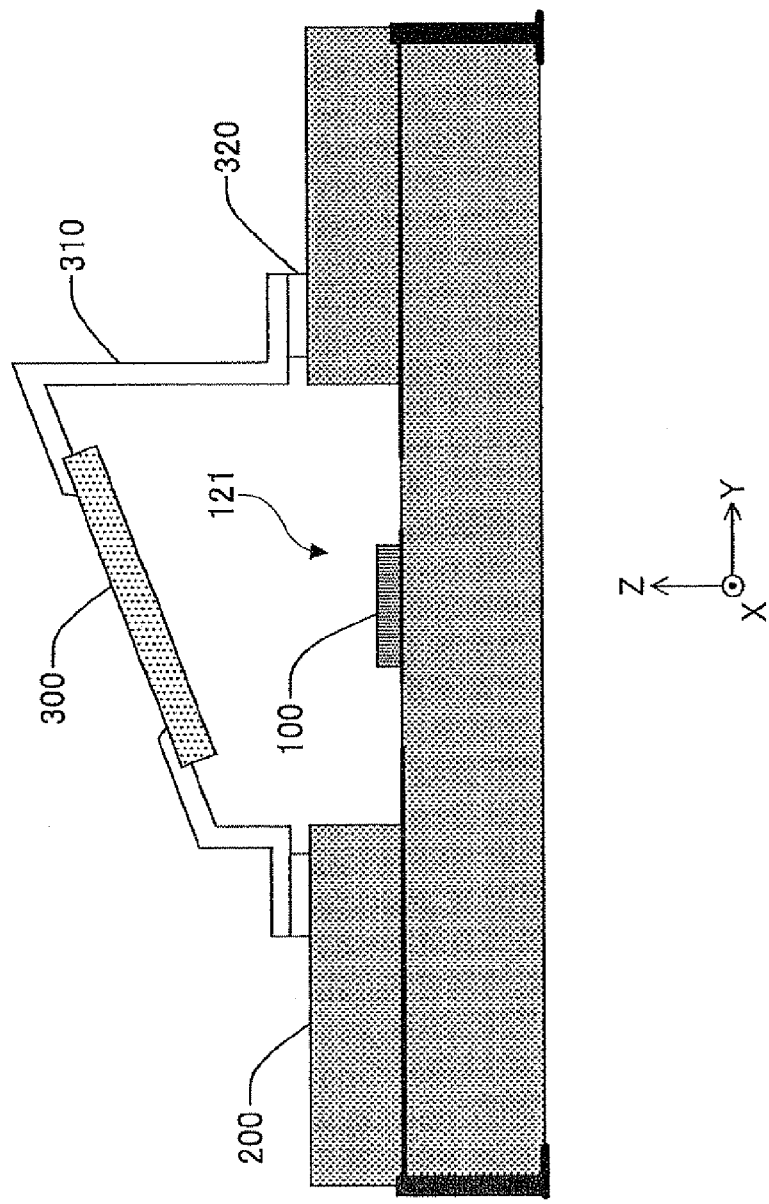
FIG. 5 is a cross section taken along line A-A' of FIG. 4.
Figure 6:
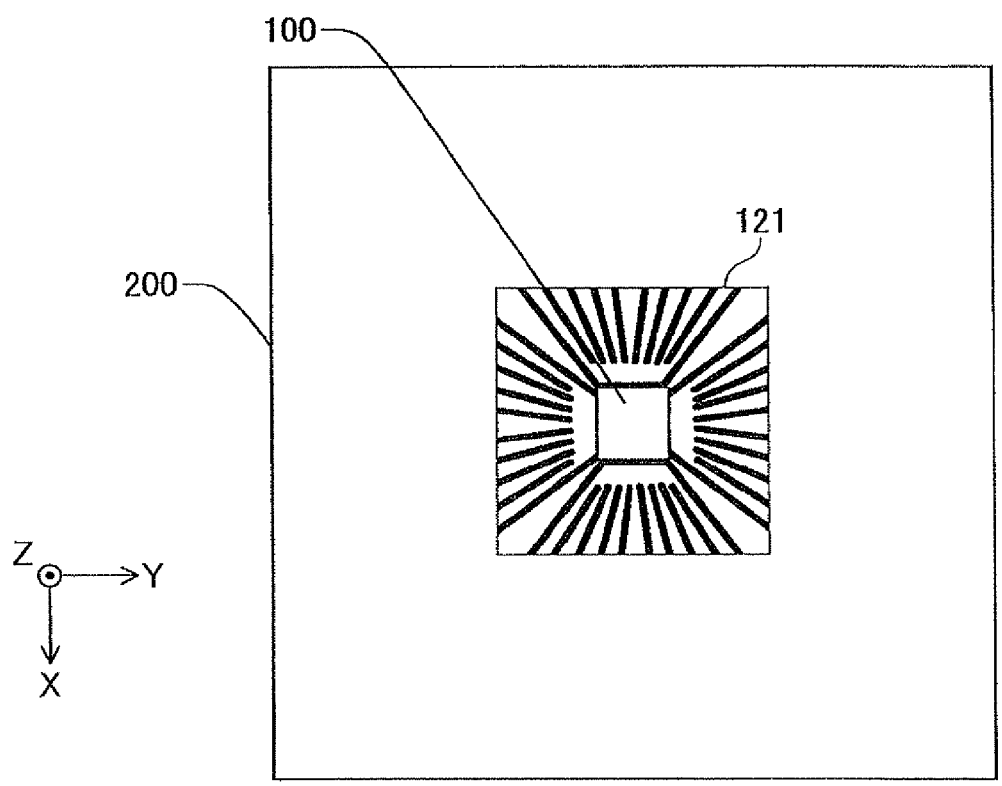
FIG. 6 is a plan view of the optical device from which a cover glass and a cap have been removed.

FIG. 4 is a plan view of the optical device 510. As illustrated, the optical device 510 includes a laser chip 100, a package member 200 on which the laser chip 100 is retained, a cover glass 300, a cap 310, and a ring 320. FIG. 5 is a cross section taken along line A-A' of FIG. 4. FIG. 6 is a plan view of the laser chip 100 mounted on the package member 200. The laser chip 100 is connected to the package member 200 via bonding wire, which is not illustrated in FIGS. 5 and 6.

Figure 8:
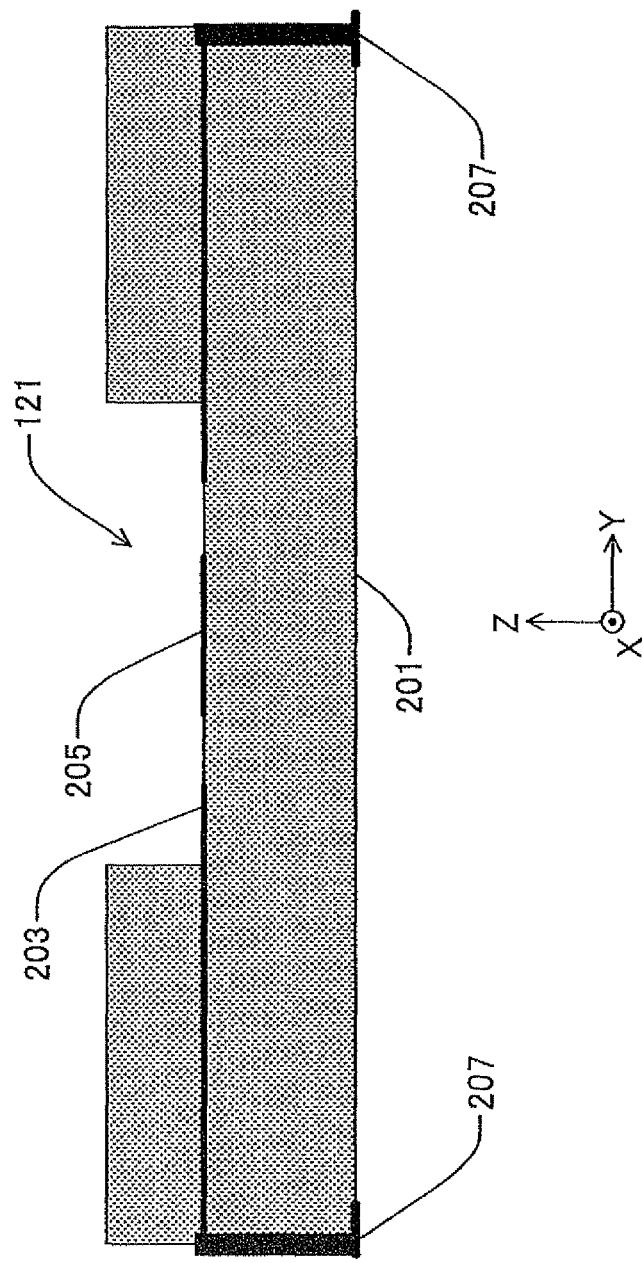
FIG. 8 is a cross section taken along line A-A' of FIG. 7.

The package member 200 is a flat package referred to as a CLCC (ceramic leadless chip carrier) having a spatial area 121 (see FIG. 5 or 8) on the +Z side enclosed by walls. The package member 200 has a multilayer structure including a ceramic substrate 201 and a plurality of metal leads 203, as illustrated in FIG. 7 and FIG. 8 which is a cross section taken along line A-A' of FIG. 7. The metal leads 203 are extended from the center and individually connected to respective metal casters 207 disposed on the sides of the package member 200.

A metal film 205 is disposed at the center on a bottom surface in the spatial area. The metal film 205, which may be referred to as a "die attach area", provides a common electrode where eight of the metal leads 203 that are located at the four corners of the spatial area 121 are connected to the metal film 205. The laser chip 100 may be die-bonded to the metal film 205 at substantially the center on the bottom surface of the spatial area 121, using a solder material of AuSn, for example. Thus, the laser chip 100 is retained on the bottom surface of the spatial area 121 surrounded by walls.

Figure 9:
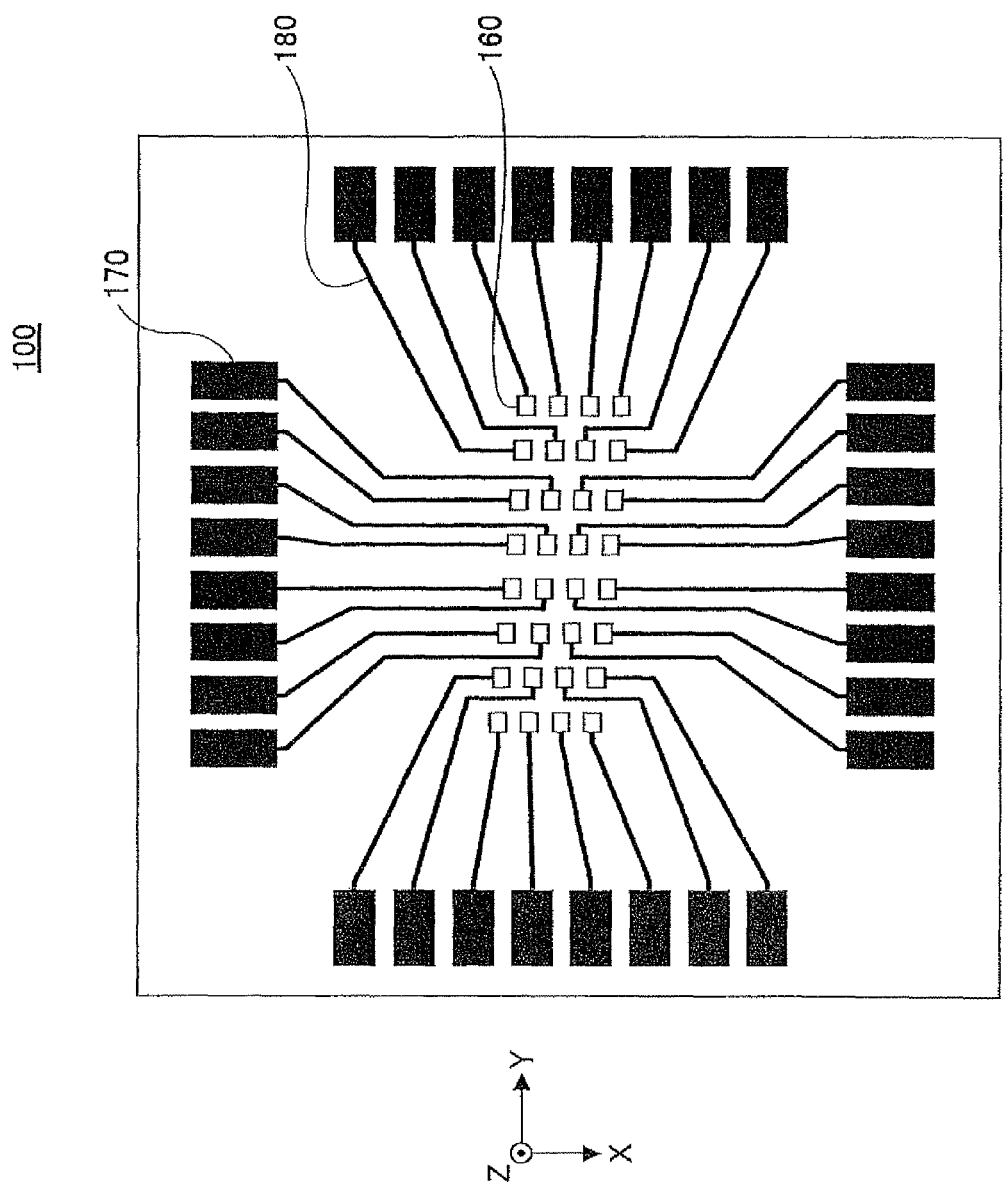
FIG. 9 is a plan view of a laser chip in the optical device.

FIG. 9 is a plan view of the laser chip 100, illustrating a two-dimensional arrangement of 32 light-emitting portions 160 and 32 electrode pads 170 disposed around the light-emitting portions 160 in a corresponding manner. The electrode pads 170 are electrically connected to the corresponding light-emitting portions 160 using leads 180. The electrode pads 170 are connected to the corresponding metal leads 203 by wire bonding.

Figure 10:
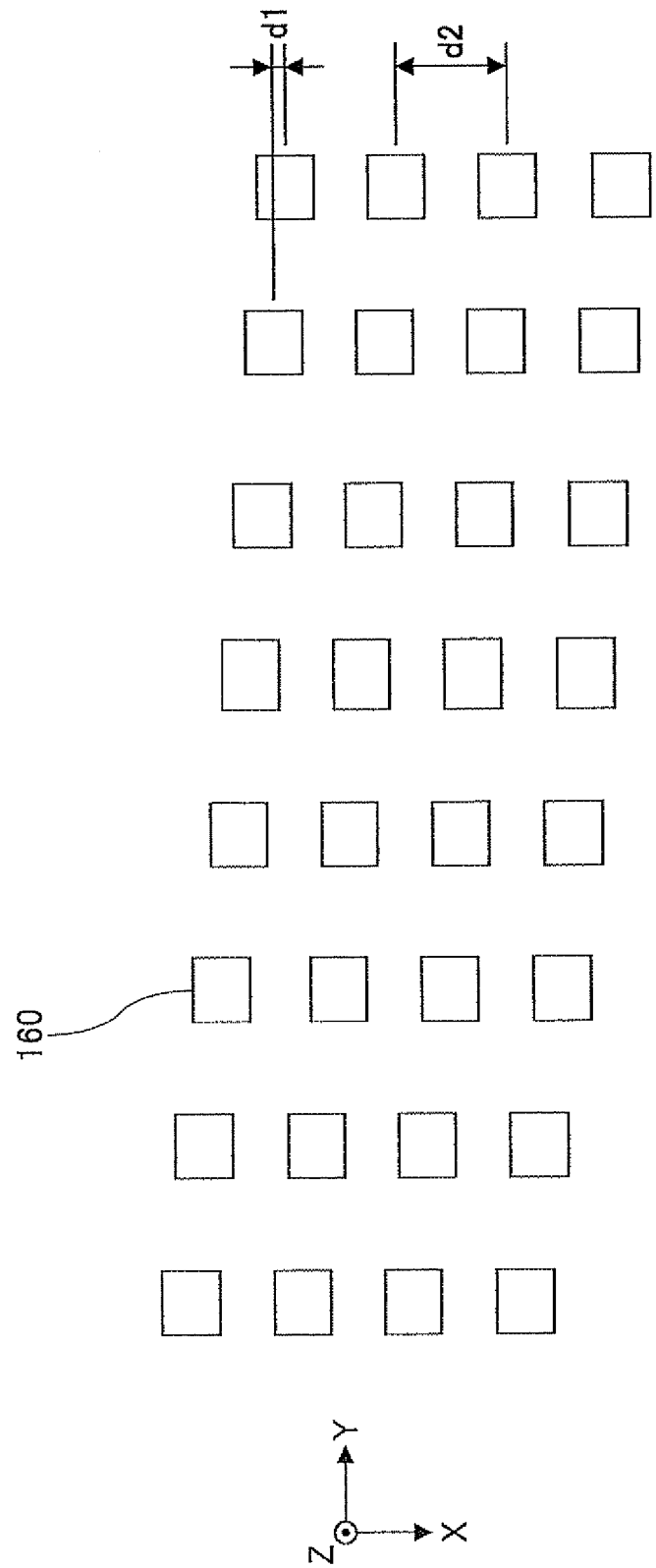
FIG. 10 illustrates an arrangement of a plurality of light-emitting portions in the laser chip.

FIG. 10 is a plan view of an arrangement of the 32 light-emitting portions 160 where the light-emitting portions 160 are disposed at regular intervals d1 in an orthographic projection of all of the light emitting portions 160 on a virtual line extending in the X-axis direction. The interval d1 refers to the distance between the centers of two adjacent light-emitting portions 160 in the orthogonal projection. In accordance with the present embodiment, the light-emitting portions 160 comprise VCSELs having an oscillating wavelength in a 780 nm band. Thus, the laser chip 100 is a so-called surface-emitting laser array chip.

Figure 11:
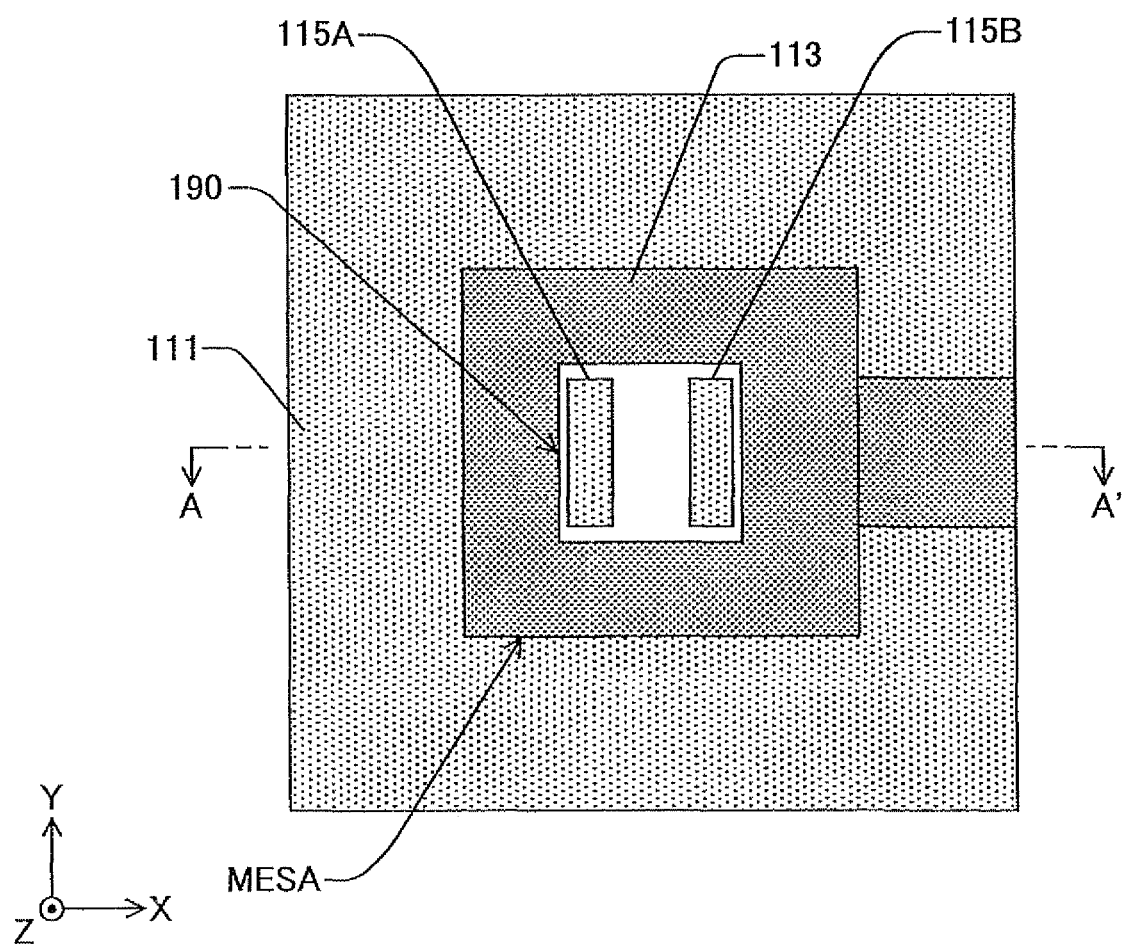
FIG. 11 is a plan view of a light-emitting portion of the laser chip.
Figure 12:
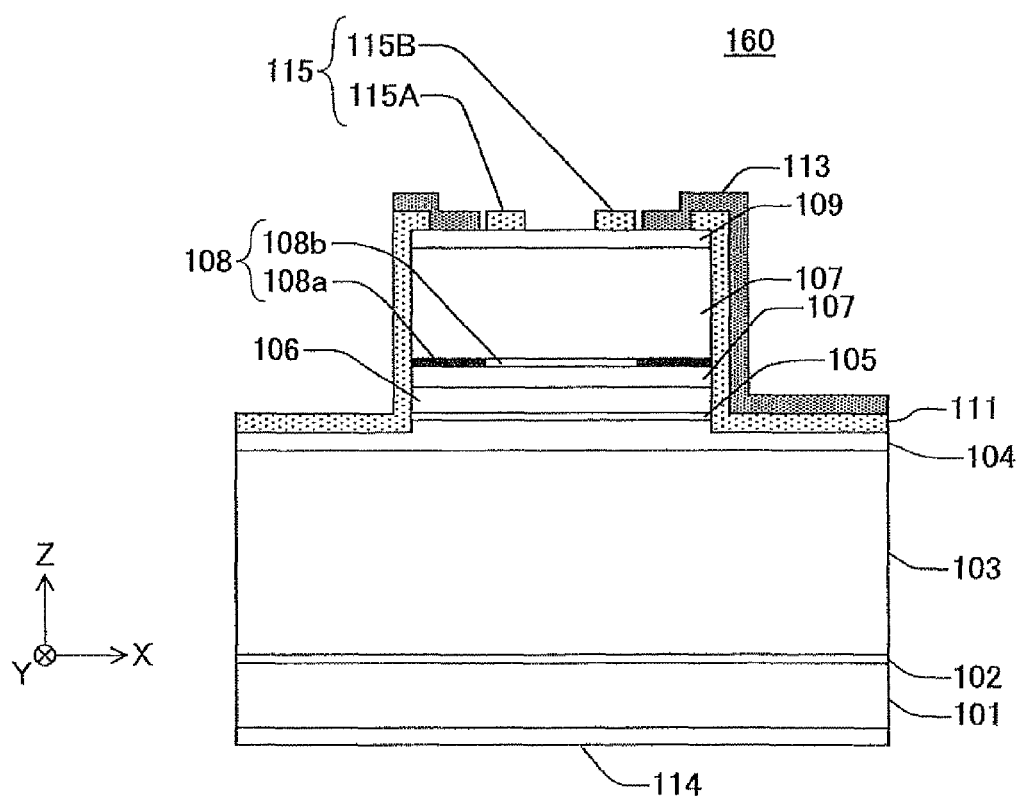
FIG. 12 is a cross section taken along line A-A' of FIG. 11.

FIG. 11 is a plan view of the light-emitting portion 160. FIG. 12 is a cross section taken along line A-A' of FIG. 11. As illustrated, the light-emitting portion 160 includes a substrate 101; a buffer layer 102; a lower semiconductor DBR (distributed Bragg reflector) 103; a lower spacer layer 104; an active layer 105; an upper spacer layer 106; an upper semiconductor DBR 107; a contact layer 109; a p-side electrode 113; an n-side electrode 114; and a mode filter 115.

The substrate 101 comprises a n-GaAs single crystal substrate. The buffer layer 102 comprises n-GaAs and is stacked on the +Z side of the substrate 101. The lower semiconductor DBR 103 is stacked on the +Z side of the buffer layer 102. The lower semiconductor DBR 103 includes 40.5 pairs of a low-refractive index layer of n-AlAs and a high-refractive index layer of n-$Al_{0.3}Ga_{0.7}As$. In order to reduce electric resistance, a graded composition layer of a thickness of 20 nm in which the composition is gradually changed from one composition to another is provided between adjacent refractive index layers. Each refractive index layer has an optical thickness of $\lambda/4$ including one half of the adjacent graded composition layers, where $\lambda$ is the oscillation wavelength. When the optical thickness is $\lambda/4$, an actual thickness D of the layer is D=$\lambda/4n$ (where n is the refractive index of the layer medium).

The lower spacer layer 104 is stacked on the +Z side of the lower semiconductor DBR 103 and comprises non-doped $(Al_{0.1}Ga_{0.9})_{0.5}In_{0.5}P$. The active layer 105 is stacked on the +Z side of the lower spacer layer 104 and includes a triple quantum well structure of GaInAsP/GaInP. The quantum well layer comprises a GaInP mixed crystal into which As is introduced in order to obtain an oscillation wavelength of the 780 nm band. The quantum well layer has a compressive strain of 0.7%. The barrier layer is provided with a tensile strain of 0.6% in order to increase its bandgap and realize a high carrier-confining effect, while forming a strain-compensating structure for the quantum well layer. The upper spacer layer 106 is stacked on the +Z side of the active layer 105 and comprises non-doped $(Al_{0.1}Ga_{0.9})_{0.5}In_{0.5}P$.

The portion including the lower spacer layer 104, the active layer 105, and the upper spacer layer 106 may be referred to as a cavity structure whose optical thickness is set to correspond to a single wavelength. The active layer 105 is disposed at the center of the cavity structure corresponding to the anti-node of the standing wave distribution of an electric field so that a high probability of stimulated emission can be obtained.

The upper semiconductor DBR 107 is stacked on the +Z side of the upper spacer layer 106 and comprises 25 pairs of a low-refractive index layer of p-$Al_{0.9}Ga_{0.1}As$ and a high-refractive index layer of p-$Al_{0.3}Ga_{0.7}As$. In order to reduce electric resistance, a graded composition layer is provided between adjacent refractive index layers in which the composition is gradually changed from one composition to another. Each refractive index layer has an optical thickness of $\lambda/4$ including one half of the adjacent inclined compositions. In one of the low-refractive index layers in the upper semiconductor DBR 107, a selective oxidization layer 108 of p-AlAs having a thickness of 33 nm is inserted. Specifically, the selective oxidization layer 108 is inserted at a position corresponding to the third node from the active layer 105 in the standing wave distribution of an electric field. The contact layer 109 is stacked on the +Z side of the upper semiconductor DBR 107 and comprises p-GaAs. The semiconductor layers stacked on the substrate 101 may be referred to as a "stacked body".

The mode filter 115 includes first and second mode filters 115A and 115B. The mode filter 115 is disposed in a part of an emission area 190 on the +Z side of the contact layer 109 that is outside a central portion of the emission area 190. The mode filter 115 comprises a transparent dielectric film configured to reduce the reflectivity of the part of the emission area where the mode filter 115 is disposed, compared to the reflectivity of the central portion.

A method of manufacturing the laser chip is briefly described.

Figure 13:
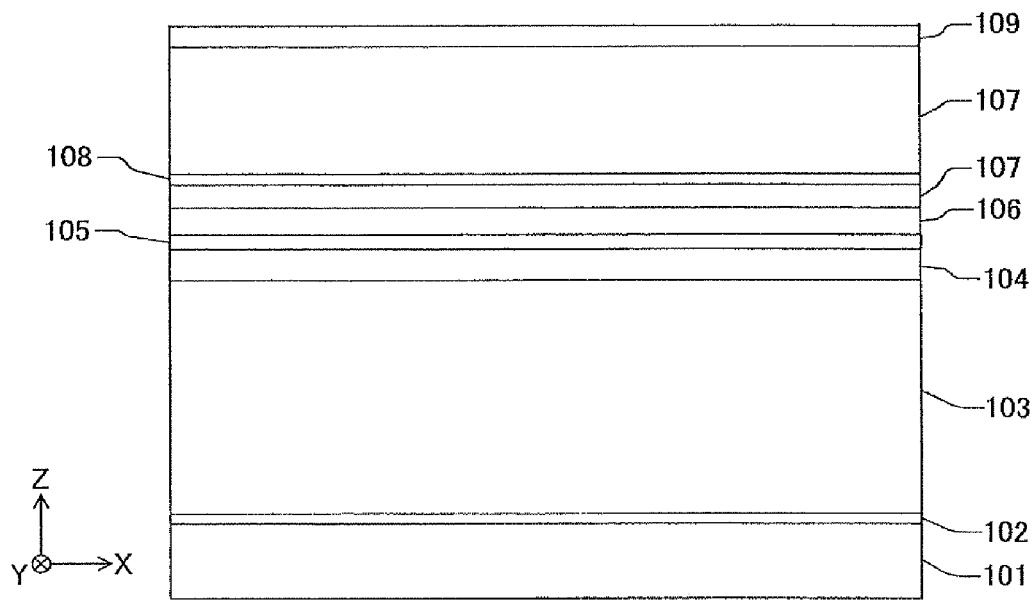
FIG. 13 illustrates a step in a process of manufacturing a laser chip.

(1) The stacked body is prepared by a crystal growth method, such as metal organic chemical vapor deposition (MOCVD) or molecular beam epitaxy (MBE) (see FIG. 13). In the case of MOCVD, the Group III material may include trimethylaluminium (TMA), trimethylgalium (TMG), or trimethylindium (TMI), and the Group V material may include phosphine ($PH_3$) or arsine ($AsH_3$). A p-type dopant material may include carbon tetrabromide ($CBr_4$) or dimethylzinc (DMZn). An n-type dopant material may include hydrogen selenide ($H_2Se$).

(2) A resist pattern of a square shape having a length of 25 μm in each side is formed on a surface of the stacked body.

(3) Using ECR etching process involving $Cl_2$ gas, and using the resist pattern as a photomask, a square-pillar shaped mesa structure (which may be referred to simply as a "mesa") is formed, where an etched bottom is located within the lower spacer layer 104.

Figure 14:
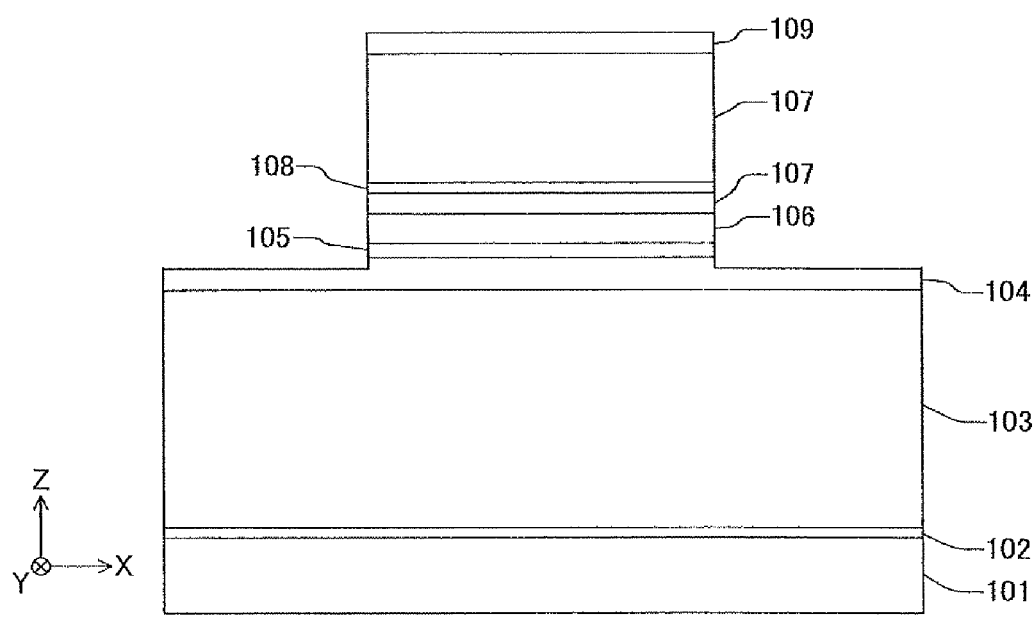
FIG. 14 illustrates another step of the process of manufacturing the laser chip.

(4) The photomask is removed (see FIG. 14).

Figure 15:
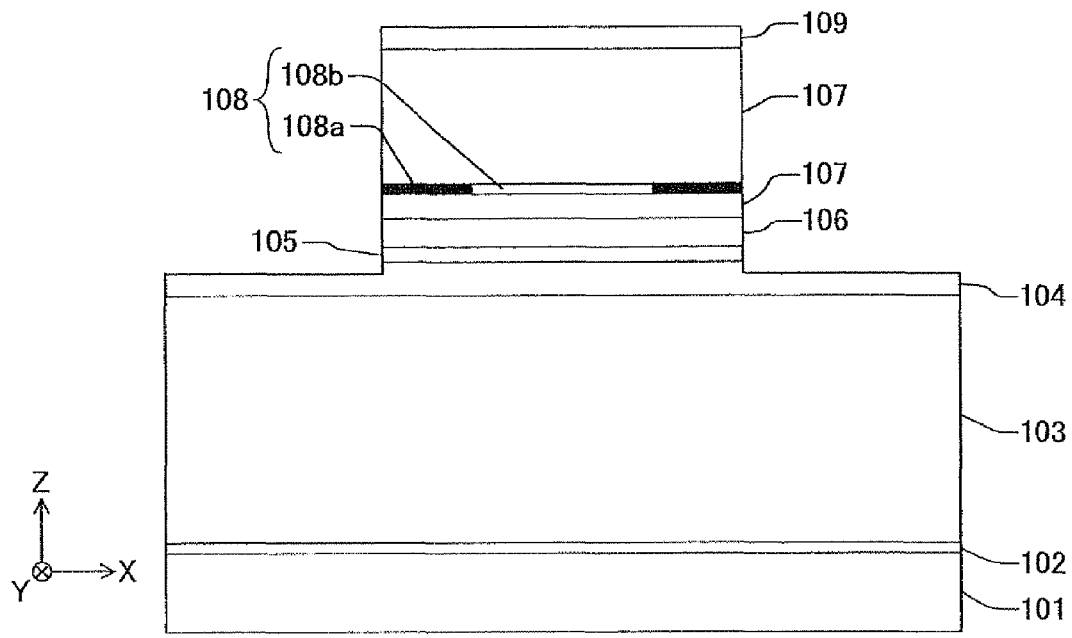
FIG. 15 illustrates another step of the process of manufacturing the laser chip.

(5) The stacked body is heat-processed in the presence of water vapor in order to selectively oxidize Al (aluminum) in the selective oxidization layer 108 from the periphery of the mesa, leaving a region 108b at the center of the mesa that is not oxidized and surrounded by an Al oxidized layer 108a (see FIG. 15). Thus, an oxidized confinement structure is formed that limits the passage of a drive current for the light-emitting portion to the central portion of the mesa. Namely, the un-oxidized region 108b forms a current passage region (current injection region). In this way, a square-shaped current passage region having a width of approximately 4 μm is formed.

Figure 16:
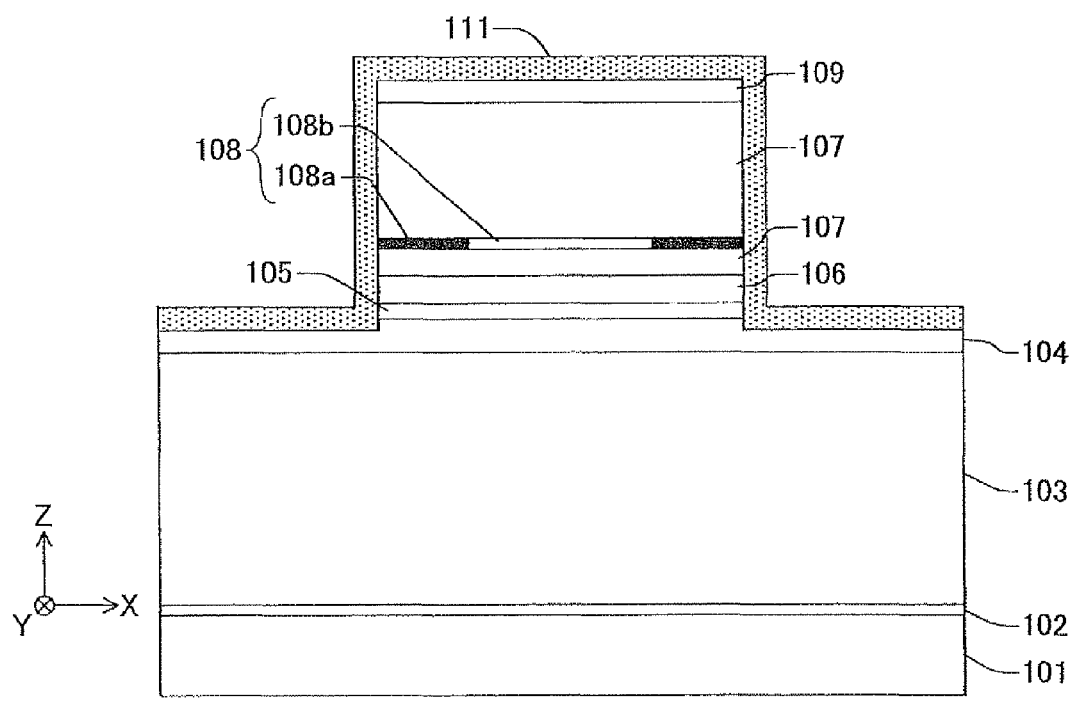
FIG. 16 illustrates another step of the process of manufacturing the laser chip.

(6) By chemical vapor deposition (CVD), the protection layer 111 of SiN is formed (see FIG. 16) to an optical thickness of $\lambda/4$. Specifically, the actual film thickness (=$\lambda/4n$) may be approximately 105 nm given that the refractive index n of SiN is 1.86 and the oscillation wavelength $\lambda$ is 780 nm.

Figure 17:
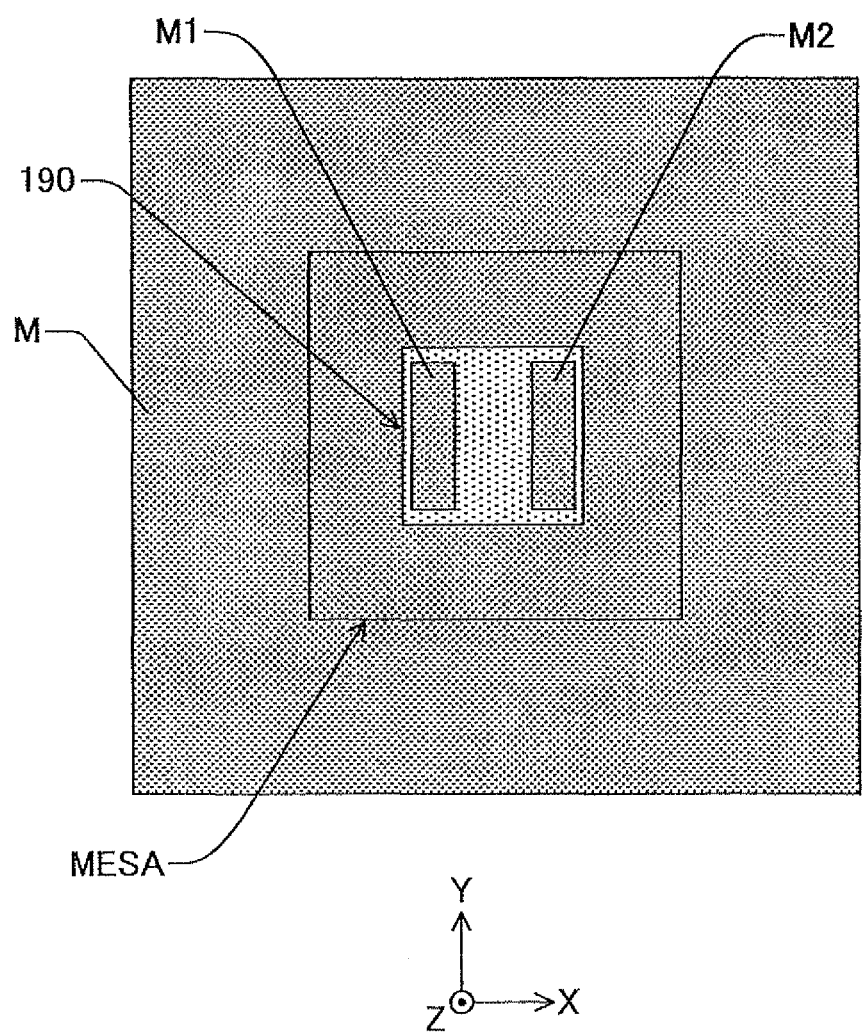
FIG. 17 is a plan view of a mask M.

(7) An etching mask M is prepared for forming a p-side electrode contact window on a mesa upper-part that forms a laser light emitting surface. For example, as illustrated in FIG. 17, the mask M is configured to prevent the etching of first and second small regions M1 and M2 opposite each other across the central portion on top of the mesa with respect to a direction parallel to a desired polarization direction P (which is the X-axis direction in the illustrated example), a surrounding area of the mesa, the sides of the mesa, and a peripheral area on the upper surface of the mesa.

(8) The protection layer 111 is etched by BHF, thereby opening a window for the p-side electrode contact.

Figure 18:
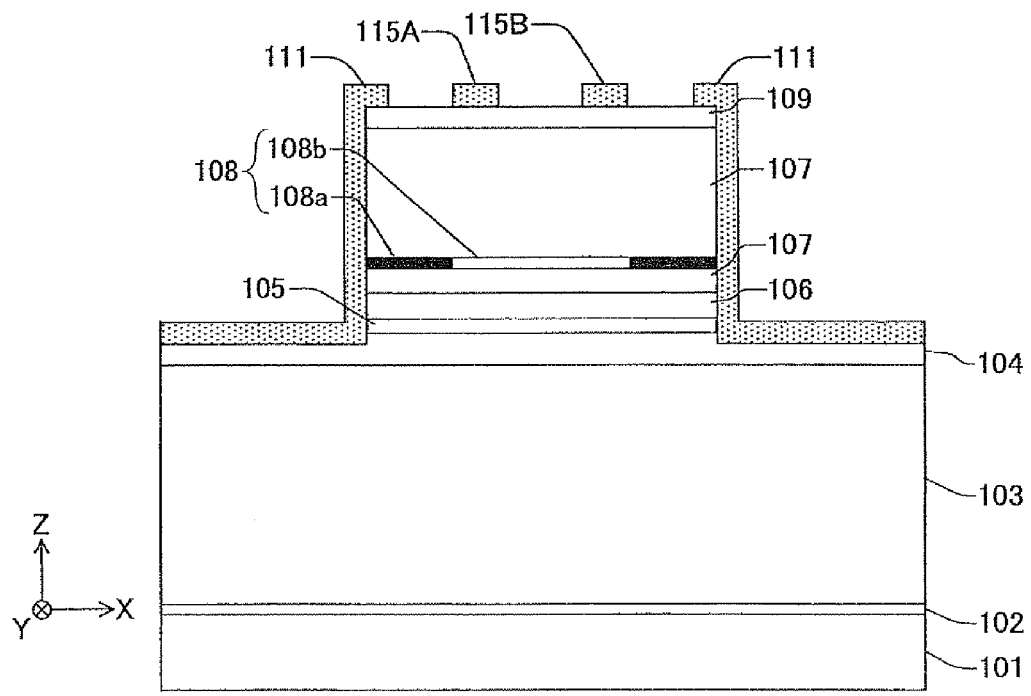
FIG. 18 illustrates another step of the process of manufacturing the laser chip.
Figure 19:
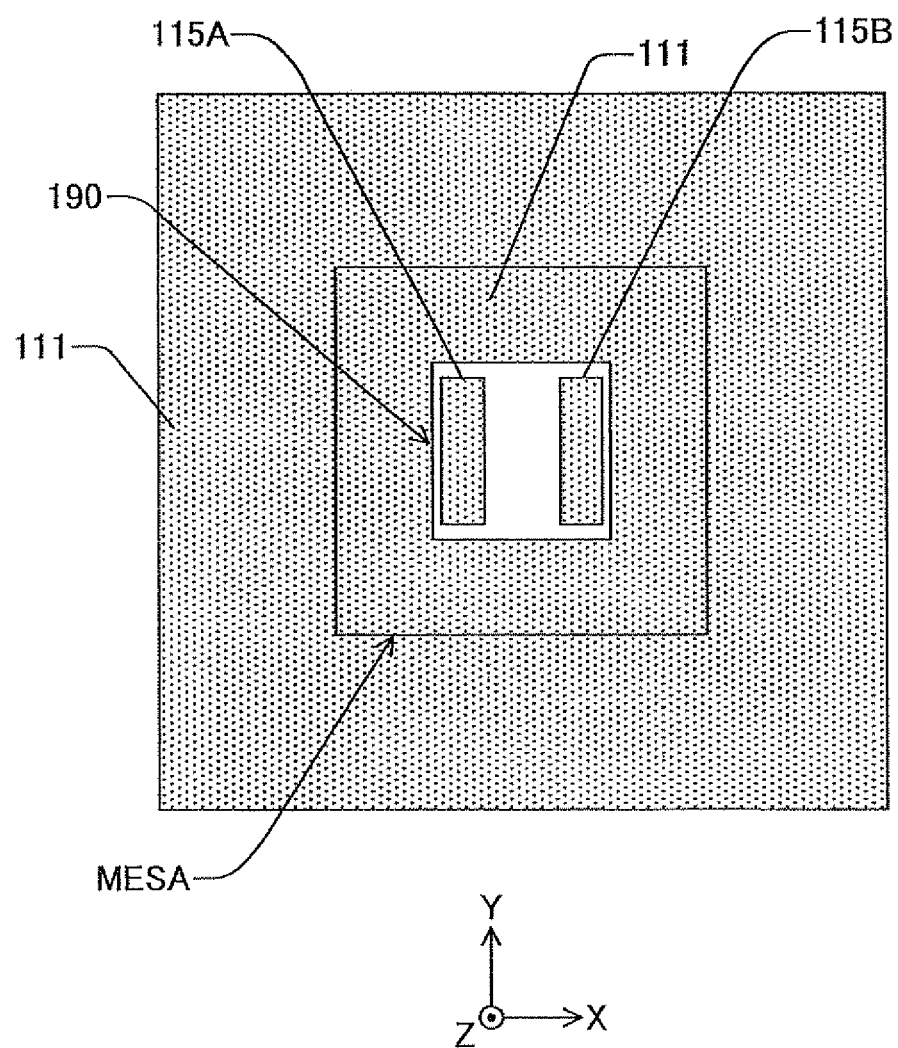
FIG. 19 is a plan view of FIG. 18.

(9) The mask M is removed (see FIGS. 18 and 19). The portion of the protection layer 111 that is left in the first small region M1 forms the first mode filter 115A, and the portion of the protection layer 111 that is left in the second small region M2 forms the second mode filter 115B. A region between the first mode filter 115A and the second mode filter 115B has shape anisotropy.

(10) A square-shaped resist pattern measuring 10 μm in each side is formed in a region on the mesa upper-part that forms the emission area 190, and a p-side electrode material is deposited. The p-side electrode material may include a multilayer film of Cr/AuZn/Au or Ti/Pt/Au.

Figure 20:
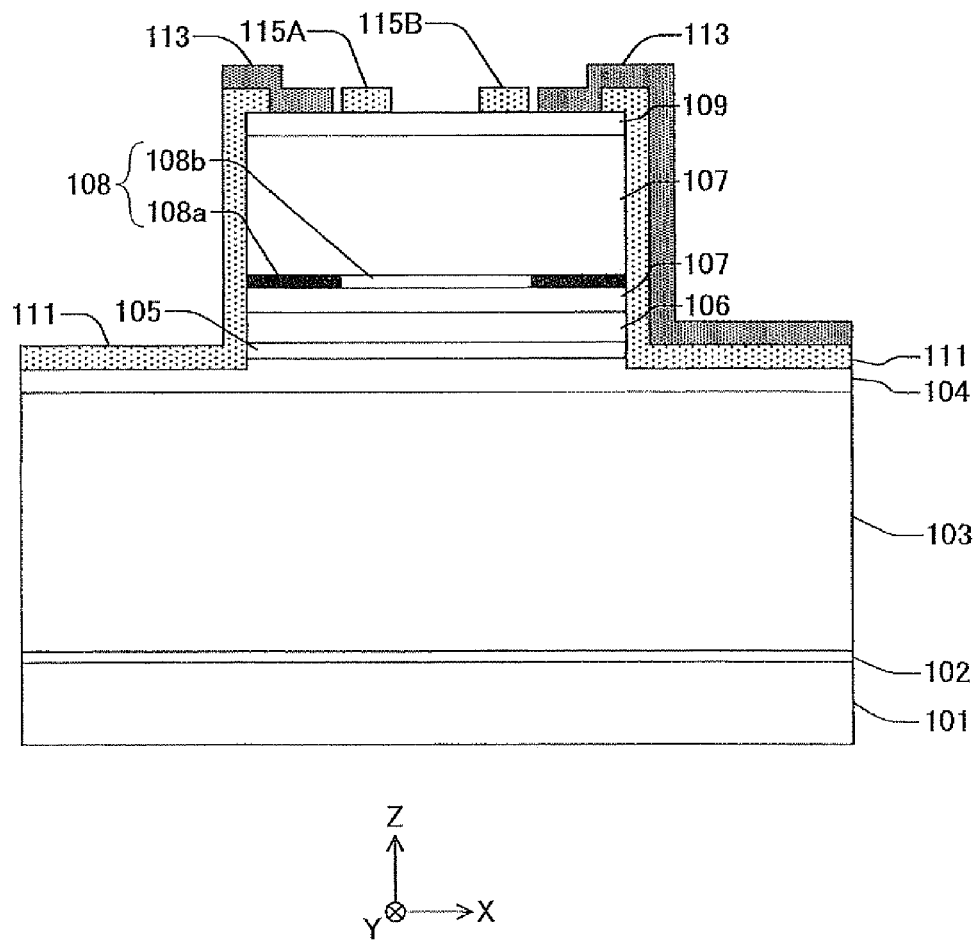
FIG. 20 illustrates another step of the process of manufacturing the laser chip.

(11) The electrode material deposited in the emission area 190 is lifted off, thus forming the p-side electrode 113 (see FIG. 20). The region surrounded by the p-side electrode 113 forms the emission area 190. In accordance with the present embodiment, the first and the second mode filters 115A and 115B, which comprise the transparent dielectric film of SiN having an optical thickness of $\lambda/4$, are present in the first and second small regions M1 and M2, respectively, of the emission area 190. Thus, the reflectivity of the first and the second small regions M1 and M2 of the emission area 190 is lower than the reflectivity of the central portion of the emission area 190.

Figure 21:
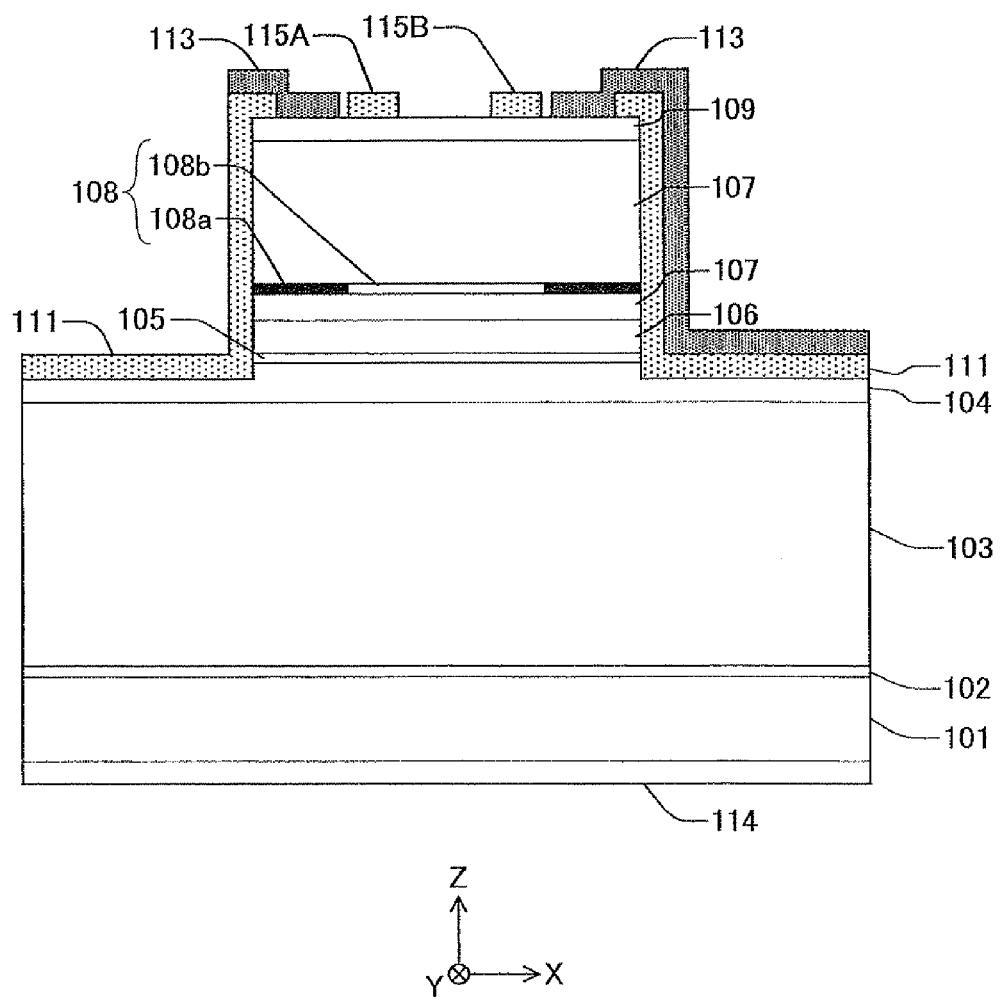
FIG. 21 illustrates another step of the process of manufacturing the laser chip.

(12) After a back surface of the substrate 101 is ground to a predetermined thickness (such as on the order of 100 μm), the n-side electrode 114 is formed (see FIG. 21). The n-side electrode 114 may include a multilayer film of AuGe/Ni/Au.

(13) Ohmic contact is provided between the p-side electrode 113 and the n-side electrode 114 by annealing, thus enabling the mesa to emit light.

(14) The substrate is cut into individual laser chips.

After various post-processes, the laser chip 100 is obtained.

Referring back to FIG. 5, the cover glass 300 is coated on both sides with an antireflection film and has a transmittance of 99% or more. The cap 310 may be made of kovar. The cover glass 300 is attached to the cap 310 using low-melting-point glass at an angle with respect to the emitting surface of the laser chip 100. The ring 320, which may be made of kovar, is fixed on the +Z side of the package member 200 by brazing for seam welding purposes. The cap 310 with the cover glass 300 is fixed to the package member 200 via the ring 320 by seam welding. Seam welding may involve the application of a weight of 500 g at a current of 90 A.

It is known that the transmittance T of a Fabry-Perot resonator can be expressed by the following expression:

$$T = \frac{I_0}{1 + \frac{4R_{DBR}}{(1-R_{DBR}^2)^2} \sin^2\left(\frac{2\pi nd}{\lambda}\cos\theta\right)} \quad (1)$$

where $I_0$ is the amount of incident light, $R_{DBR}$ is the reflectivity of the resonator, n is the refractive index of the resonator, d is the length of the resonator, θ is the incident angle of light in the resonator, and λ is wavelength.

Figure 22:
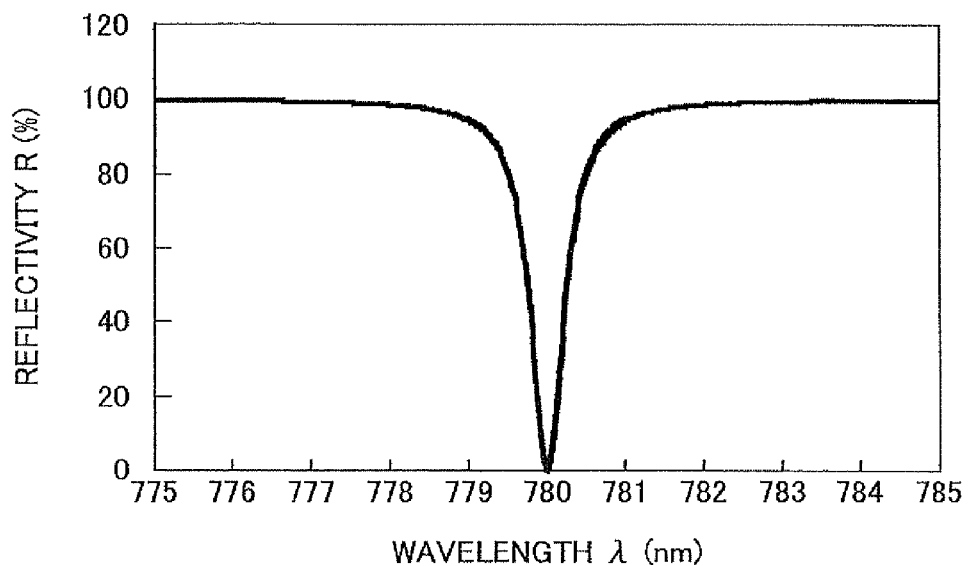
FIG. 22 is a graph illustrating the relationship between resonant wavelength and reflectivity.

FIG. 22 is a graph showing a result of calculation of a reflection spectrum of the resonator of a surface-emitting laser according to the present embodiment, in a case where the resonant wavelength λ is 780 nm, the refractive index n of the resonator is 3.3156, the reflectivity $R_{DBR}$ of the resonator is 99.8%, and the length d of the resonator is 235.25 nm. As seen from FIG. 22, the reflectivity drops sharply to 0(%) at the resonant wavelength λ=780 nm.

Figure 23:
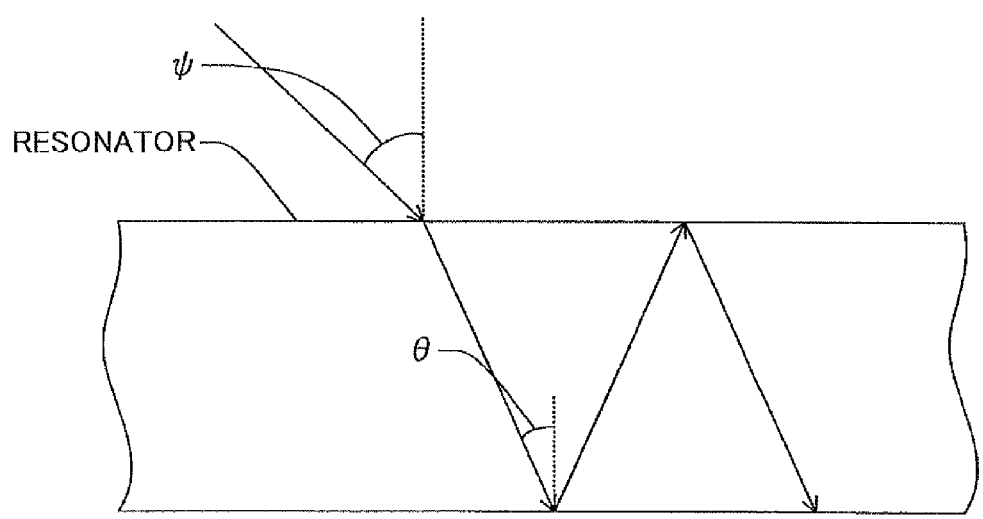
FIG. 23 illustrates an incident angle within a resonator.

According to Expression (1), as the incident angle θ within the resonator (see FIG. 23) increases from 0°, the transmittance T decreases, i.e., the reflectivity R (=1−T) increases. Thus, in order to eliminate the influence of feedback light, the reflecting angle of the feedback light is increased by inclining the cover glass, thereby making the incident angle ψ of light that is incident on the resonator sufficiently large. In this way, output variation can be eliminated.

The relationship between the incident angle Ψ on the resonator and the incident angle θ within the resonator can be expressed by the following expression:

$$\theta = \sin^{-1}\left(\frac{\sin\Psi}{n}\right) \quad (2)$$

where n is the refractive index of the resonator.

Figure 24:
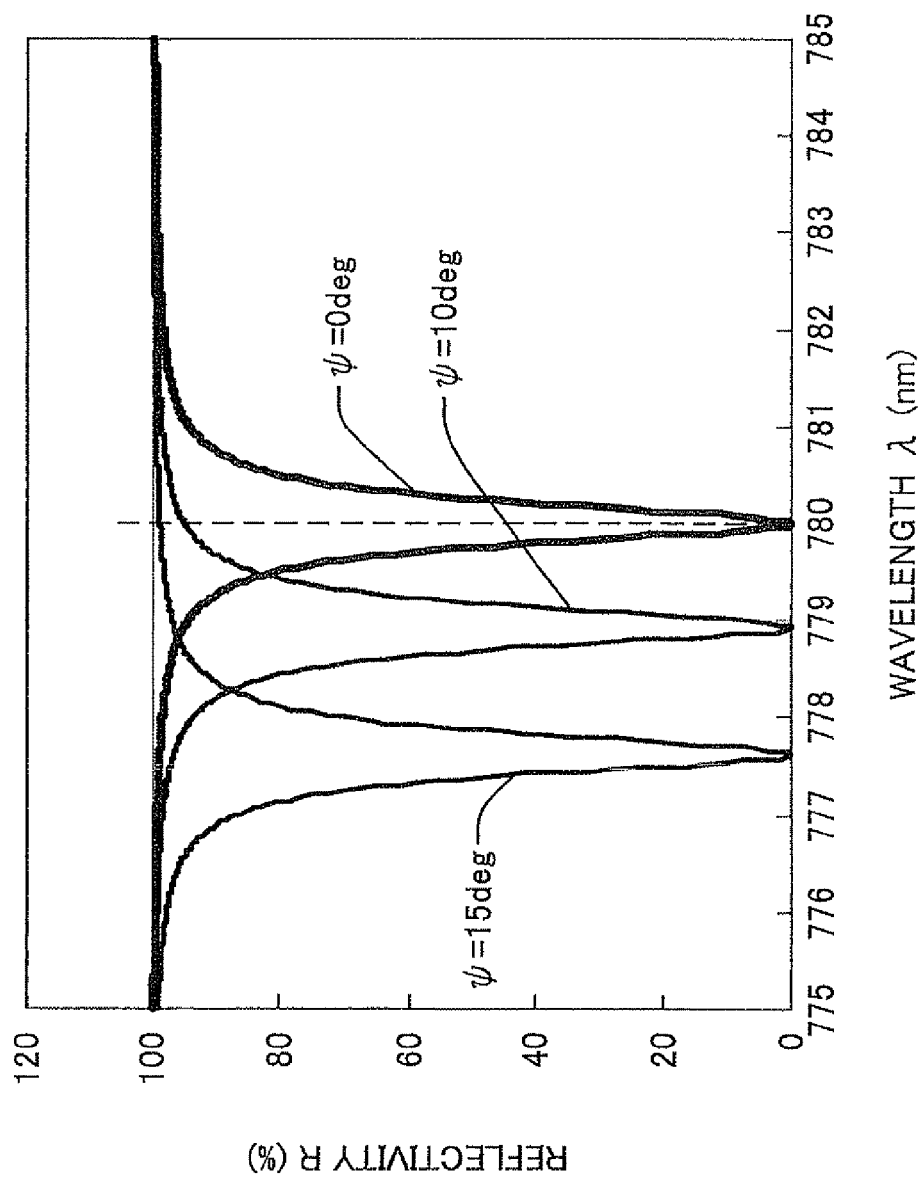
FIG. 24 is a graph illustrating the relationship between resonant wavelength and reflectivity.
Figure 25:
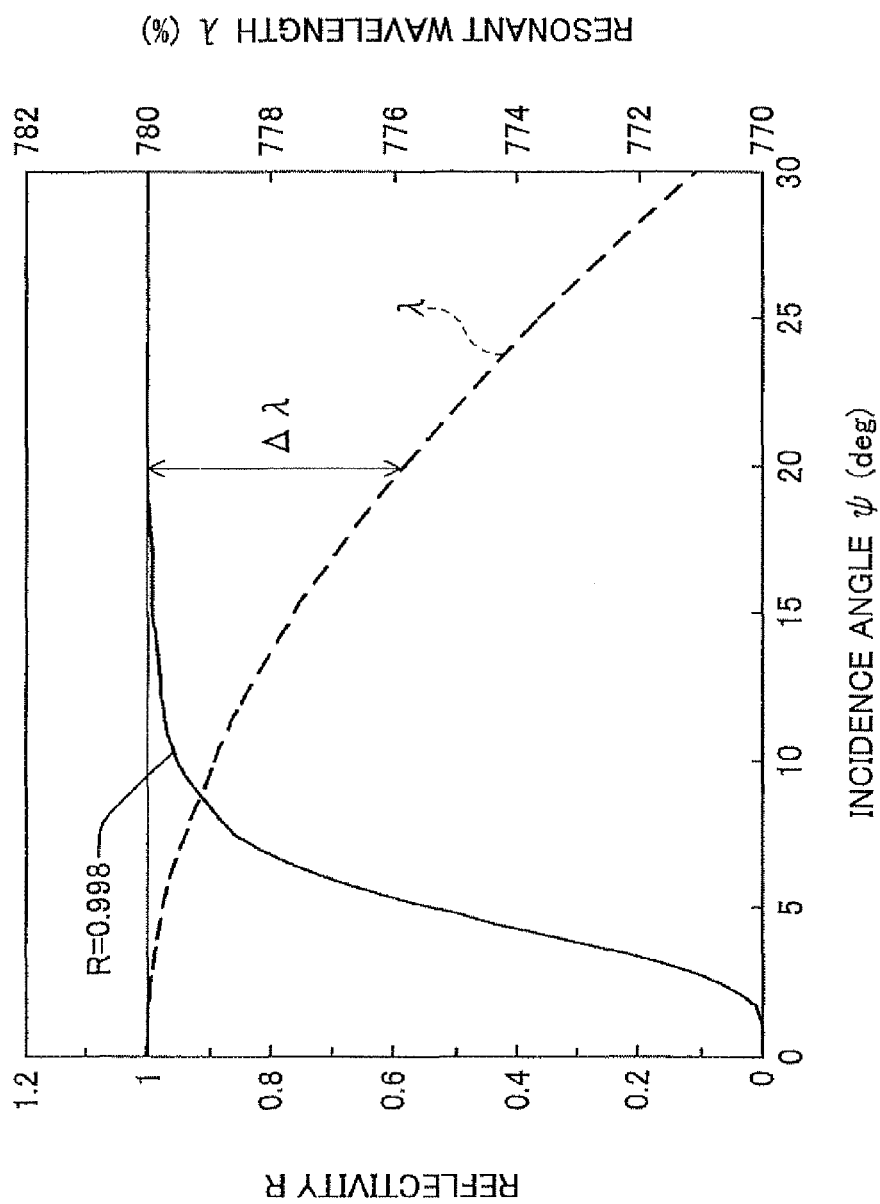
FIG. 25 is a graph illustrating the relationship between the incident angle on a resonator and reflectivity.

FIG. 24 is a graph of the reflectivity R with respect to feedback light within the resonator (which is hereafter referred to as "the resonator reflectivity") at the incident angle Ψ of 0°, 10°, and 15° with respect to the resonator. FIG. 25 is a graph based on FIG. 24, where the horizontal axis shows the incident angle Ψ with respect to the resonator and the vertical axis shows the reflectivity at 780 nm and the resonant wavelength that minimizes reflectivity. According to the graph of FIG. 25, as the incident angle Ψ increases, so does the resonator reflectivity R, such that the resonator reflectivity R can be increased to 94.9% when Ψ is 10° and to 99.6% when Ψ is 20°. Thus, almost all of the feedback light can be reflected, so that output variation can be almost eliminated.

Experiments conducted by the inventors indicate that problems associated with feedback light can be eliminated when the resonator reflectivity R is 99% or more. Such incident angle Ψ with respect to the resonator where the problems due to feedback light are eliminated may be referred to as "the critical incident angle $\Psi_0$". The critical incident angle $\Psi_0$ may be easily set by referring to FIG. 25. For example, when the critical incident angle $\Psi_0$ is such that R=99%, it is seen from FIG. 25 that the critical incident angle $\Psi_0$ is 15°. The resonant wavelength of the feedback light incident at that angle is 777.6 nm according to FIG. 25, where the difference Δλ from the resonant wavelength (780 nm) at the angle of 0° is 2.4 nm.

When the incident angle of the feedback light is changed, the resonant wavelength is shifted to the shorter-wavelength side. Thus, if there is a variation in the wavelengths of the light-emitting portions of the surface-emitting laser array, the light of the shifted resonant wavelength may become incident and affect the surface-emitting laser array as another source of output variation (noise).

Therefore, regarding Δλ, wavelength variation and temperature change need to be taken into consideration. For example, when there are 32 light-emitting portions (32-ch array), it is experimentally known that there is a wavelength variation of approximately 0.5 nm. Regarding temperature, there may be a temperature difference of as much as 30° C. between start and end of operation because of the very high thermal resistance of the surface-emitting laser. Such a temperature difference is expected to cause a wavelength change on the order of 1.5 nm based on a temperature coefficient of 0.05 (nm/K) of the wavelength. Considering the above, Δλ may be at least 1.5 nm due to the temperature change, or 2.0 nm or more in view of the variation in wavelength among the light-emitting portions. Generally, a surface-emitting laser may be desirably designed such that the resonator reflectivity R is 99% or more.

From Expression (1), the relationship between the resonant wavelength λ and the incident angle θ is determined by the following expression:

$$\sin\left(\frac{2\pi nd}{\lambda}\cos\theta\right) = 0 \quad (3)$$

$$\therefore \lambda = nd \cdot \cos\theta$$

Substituting Expression (2) for θ in Expression (3) yields the following expressions:

$$\frac{\lambda}{nd} = \cos\left(\sin^{-1}\left(\frac{\sin\Psi}{n}\right)\right) \quad (4)$$

$$\Psi = \sin^{-1}\left(n \cdot \sin\left(\cos^{-1}\left(\frac{\lambda}{nd}\right)\right)\right)$$

$$\Psi = \sin^{-1}\left(n \cdot \sin\left(\cos^{-1}\left(\frac{\lambda + \Delta\lambda}{nd}\right)\right)\right) \quad (5)$$

For example, when the resonant wavelength λ=780 nm, the refractive index n=3.3156, the resonator reflectivity R=99.8%, the resonator length d=235.25 nm, and Δλ is 2.4 nm, the critical incident angle $\Psi_0$ is 15° according to Expression (5), which corresponds to the result obtained from FIG. 25.

Figure 26:
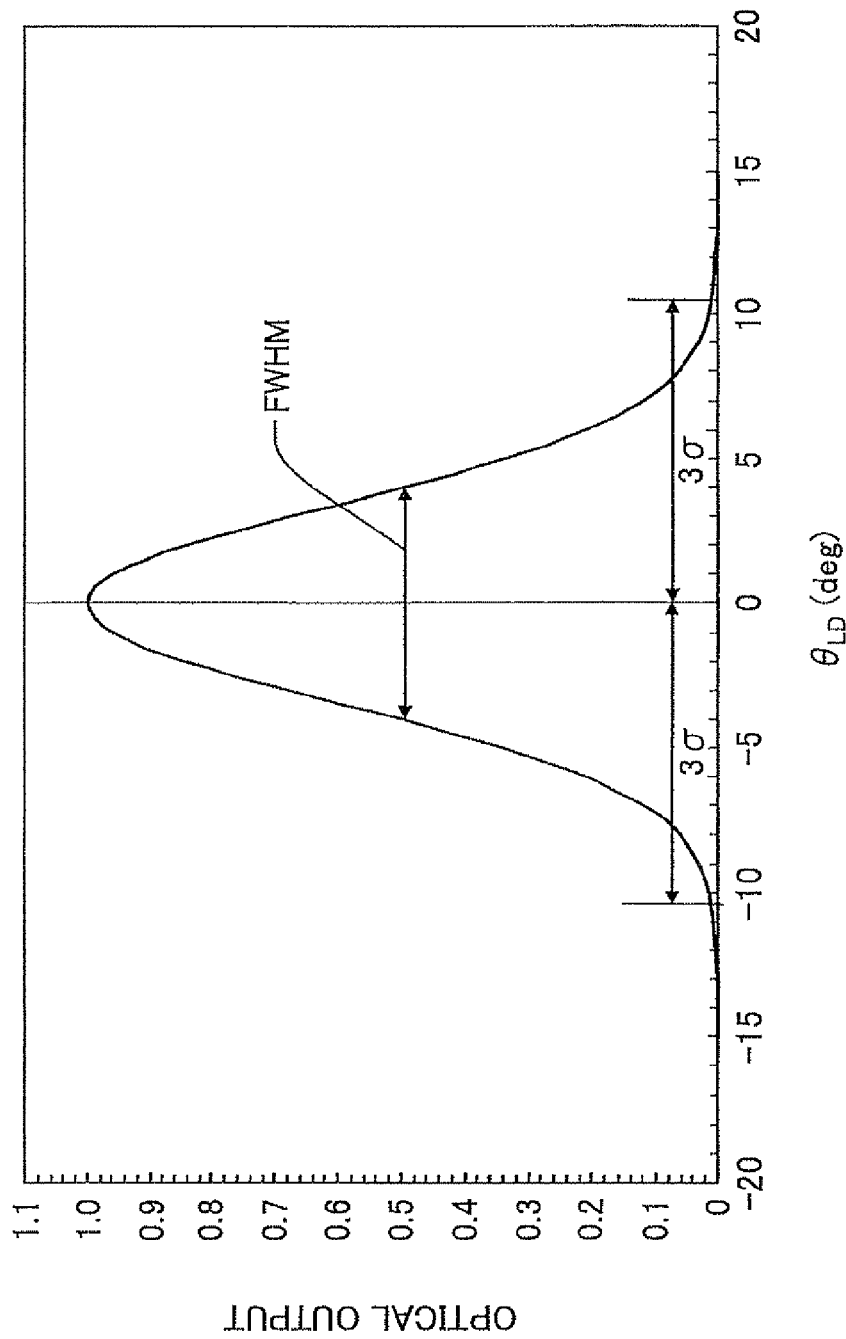
FIG. 26 is a graph illustrating a beam spreading angle.

In an actual semiconductor laser, the incident angle Ψ of feedback light needs to be set by considering the angle of spreading of light. FIG. 26 is a graph of a far-field pattern (FFP) of a surface-emitting laser. The FFP has a Gaussian distribution where FWHM (full width at half maximum)=8° and the standard deviation (half-width) σ=3.4°. Experiments indicate that, in order to eliminate the influence of feedback light, the light emitted by a semiconductor laser needs to have a beam spreading angle $\theta_{LD}$ of at least 2σ and preferably 3σ or more.

Figure 27:
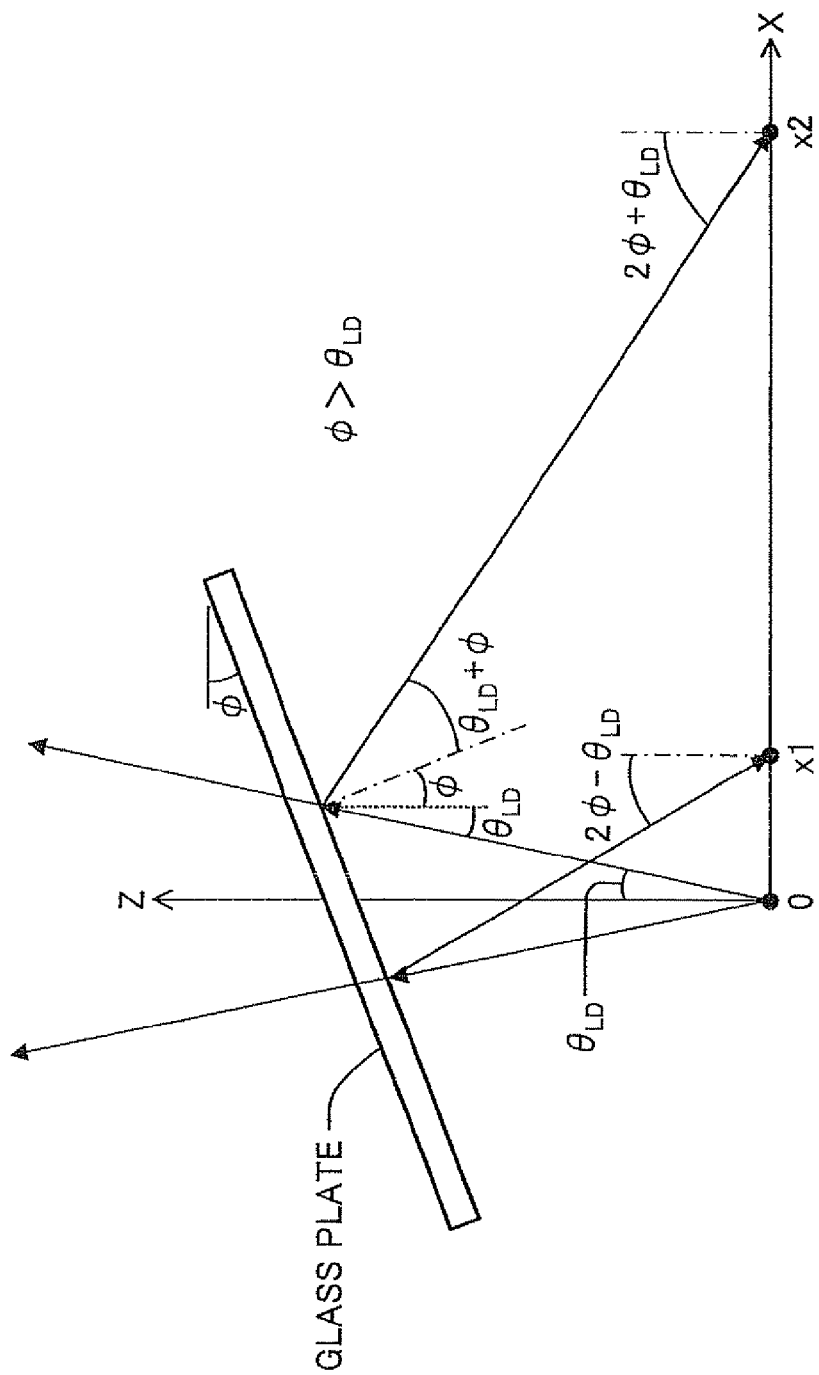
FIG. 27 illustrates the relationship between the inclination angle of a glass plate and the trajectory of light emitted by a light-emitting portion according to an embodiment of the present invention.

FIG. 27 illustrates a trajectory of feedback light in a case where a glass plate is disposed immediately above a light-emitting portion in consideration of the beam spreading angle $\theta_{LD}$. The glass plate is inclined with an inclination angle φ with respect to the normal to the emitting surface of the light-emitting portion. As illustrated in FIG. 27, the light emitted from the light-emitting portion 0 and having a spreading angle $\pm\theta_{LD}$ is incident on points x1 and x2 on the X-axis as feedback light. In this case, the incident angle Ψ of the feedback light is $2\phi\pm\theta_{LD}$. Thus, in order to eliminate the influence of the feedback light, the incident angle Ψ needs to be equal to or more than the critical incident angle $\Psi_0$. The inclination angle φ of the glass plate is indicated by the following expression derived from Expression (5):

$$2\phi - \theta > \Psi = \sin^{-1}\left(n \cdot \sin\left(\cos^{-1}\left(\frac{\lambda + \Delta\lambda}{nd}\right)\right)\right) \quad (6)$$

$$\therefore \phi > \frac{1}{2}(\Psi + \theta) = \frac{1}{2}\left(\sin^{-1}\left(n \cdot \sin\left(\cos^{-1}\left(\frac{\lambda + \Delta\lambda}{nd}\right)\right)\right) + \theta\right)$$

When the glass plate is disposed at the angle determined by Expression (6), the incident angle Ψ of the feedback light can be more than the critical incident angle $\Psi_0$ at all times. For example, when the critical incident angle $\Psi_0$=15° and the beam spreading angle $\theta_{LD}$=15°, the inclination angle φ of the glass plate may be set to be 15° or more. When the spreading angle is 2σ(=6.8°) in the case of the same semiconductor laser having the FFP of FIG. 26, the inclination angle φ of the glass plate can be further reduced to 10.9°.

Thus, in accordance with the present embodiment, in a resonator having the refractive index n, the reflectivity R, and the resonator length d, (1) the critical incident angle $\Psi_0$ such that the influence of feedback light can be eliminated is determined by setting the shift amount Δλ of the resonant wavelength such that there is no influence of the feedback light incident on the resonator with the incident angle Ψ; and then (2) the inclination angle φ of the glass plate (cover glass) can be uniquely determined in consideration of the beam spreading angle $\theta_{LD}$.

For comparison, the surface-emitting laser module according to Patent Document 7 is considered. In the package structure of this surface-emitting laser module, the surface-emitting laser is mounted on a heatsink portion at the center of a metal stem (having a diameter of 5.6 mm) via an electrically conductive paste. The surface-emitting laser is of a 21 (7×3) channel array structure. It is assumed that the light-emitting portion interval is 38 μm and that the light-emitting portions are arranged at equal intervals within a rectangle measuring 228 μm×76 μm.

Figure 28:
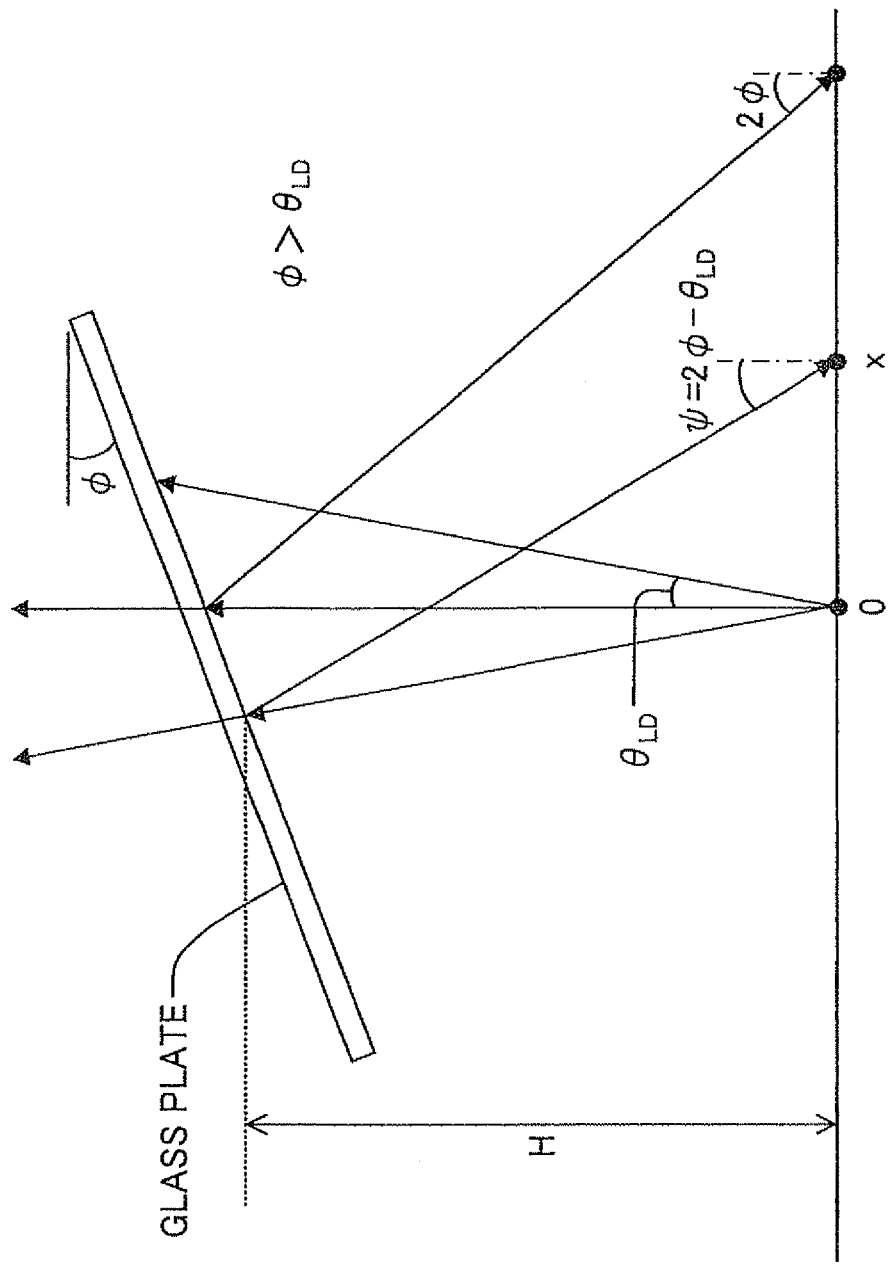
FIG. 28 illustrates the relationship between the inclination angle of the glass plate and the trajectory of light emitted by the light-emitting portion according to a related art case.

It is assumed that the spreading angle $\theta_{LD}$ in consideration of 3σ is 15°. The light emitted from the light-emitting portion 0 at one end of the array and having the spreading angle $\theta_{LD}$ is incident on the glass plate inclined at the angle φ, as illustrated in FIG. 28. When the height H of the point at which the light is incident on the glass plate is 0.5 mm, the angle φ such that the feedback light reflected by the glass plate does not become incident on the light-emitting portion at the other end x (x=228 μm) can be determined by the following:

$$\phi = \frac{1}{2}\tan^{-1}\left(\frac{2\tan\theta_{LD} + \frac{x}{H}}{1 - \tan^2\theta_{LD} - \frac{x}{H}\tan\theta_{LD}}\right) \quad (7)$$

where x is the length of the array.

Substituting the above values in Expression (7) yields the angle φ of the glass plate=25.5°, which is more than the corresponding value according to the present embodiment by more than 10°. If the number of the light-emitting portions increases, or the light-emitting portion interval is increased, the angle φ needs to be further increased, making implementation more difficult. Thus, in order to prevent the incidence of feedback light on the array, it is necessary to either increase the height H of the glass plate or decrease the number of the light-emitting portions, thus limiting the degree of freedom of design.

In accordance with the present embodiment, the influence of feedback light can be controlled even if the inclination angle of the glass plate is smaller than the inclination angle of the glass plate such that the light emitted by the light-emitting portion at one end and having the spreading angle $\theta_{LD}$ is incident on the light-emitting portion at the other end after being reflected by the glass plate. Thus, an optical device having a high degree of design freedom can be provided such that the number of the light-emitting portions or the light-emitting portion interval is not limited.

In accordance with the present embodiment, the reflectivity Rf of the upper semiconductor DBR 107 is 99.67%, the reflectivity Rr of the lower semiconductor DBR 103 is 99.98%, and the resonator reflectivity $R_{DBR}$ is √(Rf×Rr)= 99.82%. In this case, the critical incident angle $\Psi_0$ and the oscillation current threshold can be reduced by increasing the reflectivity by increasing the number of the semiconductor DBR layers. However, this results in a decrease in slope efficiency. Conversely, the threshold of oscillation current and the critical incident angle $\Psi_0$ can be increased by reducing the number of the semiconductor DBR layers and thus increasing slope efficiency. Practically, the lower limit of the resonator reflectivity R may be designed to be 99.6% by selecting the number of the semiconductor DBR layers or their materials.

In accordance with the present embodiment, when the resonant wavelength λ=780 nm, the refractive index n of the resonator=3.3156, the resonator reflectivity R=0.998, and the resonator length d=235.25 nm, Δλ is set to be 2.4 nm based on the above-described principle, thereby obtaining the critical incident angle $\Psi_0$ of 15°. Thus, the inclination angle φ of the cover glass 300 with respect to the normal to the emitting surface of the laser chip 100 may be set at 17°, considering processing error.

The laser module and the light-source unit may be evaluated by using an optical system simulating the structure of FIG. 3. The items of evaluation may include the change in the amount of emitted light over time (output waveform), which may be detected by a photodiode (PD). If there is the influence of feedback light, the detected amount of light would be destabilized, and the resultant variation in light amount could be observed.

Figure 29:
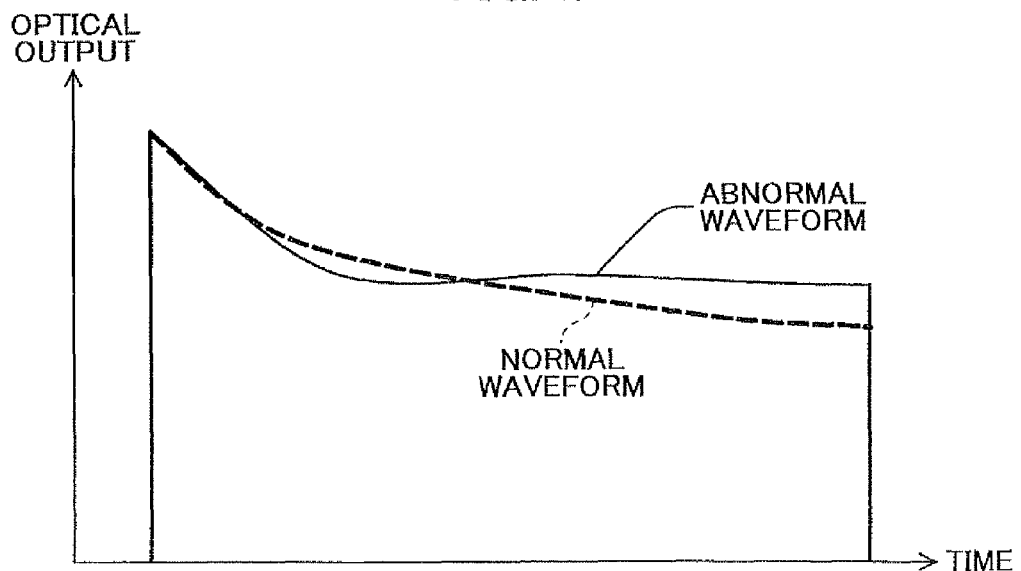
FIG. 29 is a graph illustrating an abnormal output waveform.

FIG. 29 is a graph illustrating a typical light amount variation (abnormal waveform). Such an abnormal waveform more often appears in the first half of the output waveform than in the latter half. The abnormal variation may appear in output waveforms of various frequencies ranging from 1 kHz to several hundreds of kHz. The output waveform is one of the characteristics that needs to be considered for stable drawing of a line in an image forming apparatus. Even a light amount variation on the order of several percentages may pose a problem depending on the image forming apparatus.

Figure 30:
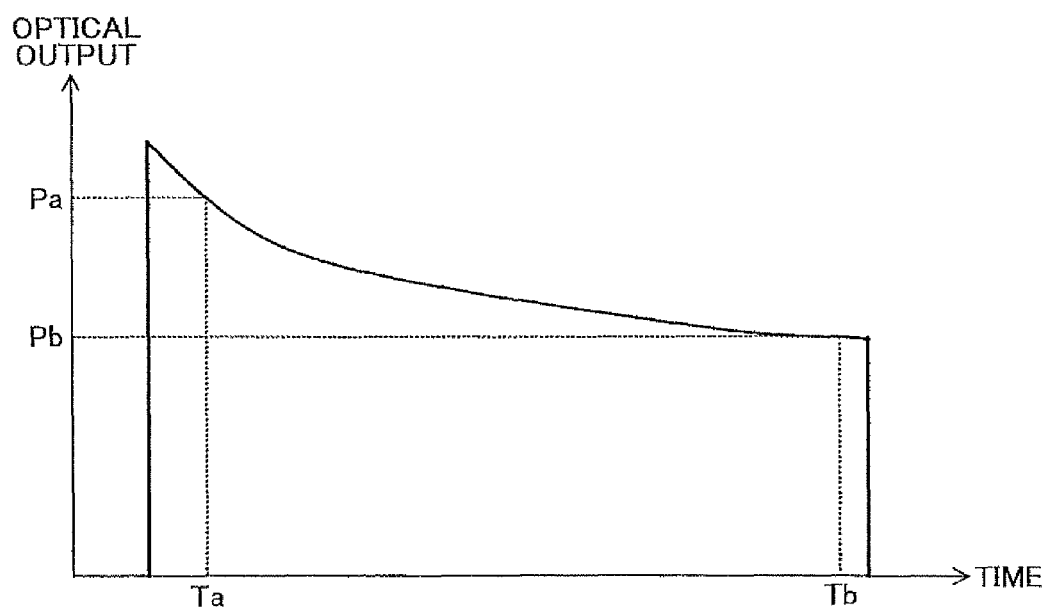
FIG. 30 is a graph illustrating a droop ratio.

When the ambient temperature is 25° C. and the target output is 1.4 mW, and when the light-emitting portions are supplied with a rectangular-wave current pulse having a pulse period of 1 ms and a pulse width of 500 µs, a droop ratio Dr (%) is defined by the following:

$$Dr=(Pa-Pb)/Pa \times 100 \qquad (8)$$

where Pa is the optical output 1 µs (Ta) after the start of pulse supply, and Pb is the optical output 480 µs (Tb) after the start of pulse supply (see FIG. 30). The droop ratio Dr may be considered as a quantified result of the light amount variation. Experiments conducted by the inventors on various types of surface-emitting laser arrays indicated that the visibility of an output image significantly deteriorates when the difference between a maximum value Dr (max) of the droop ratio and a minimum value Dr (min) of the droop ratio (which may be referred to as a "droop variation") of the surface-emitting laser array is 3% or more.

Figure 31:
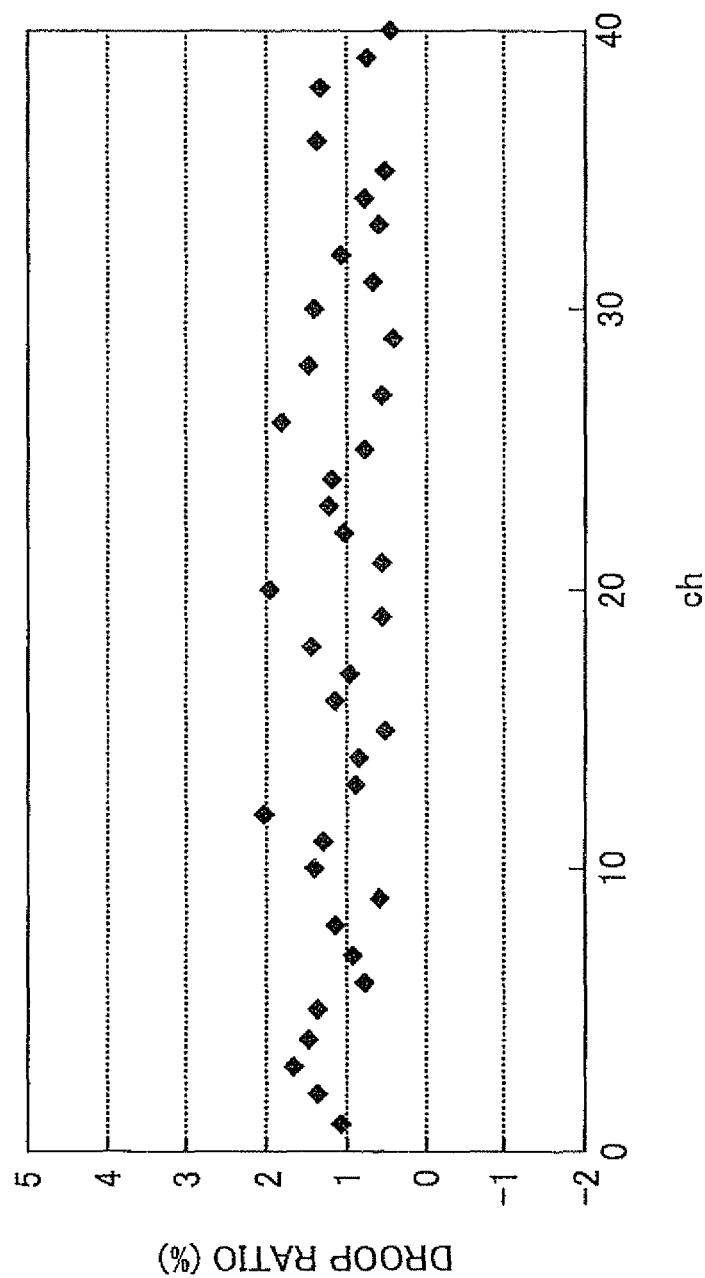
FIG. 31 is a graph illustrating the droop ratio of the light-emitting portions of an optical device according to an embodiment of the present invention.
Figure 32:
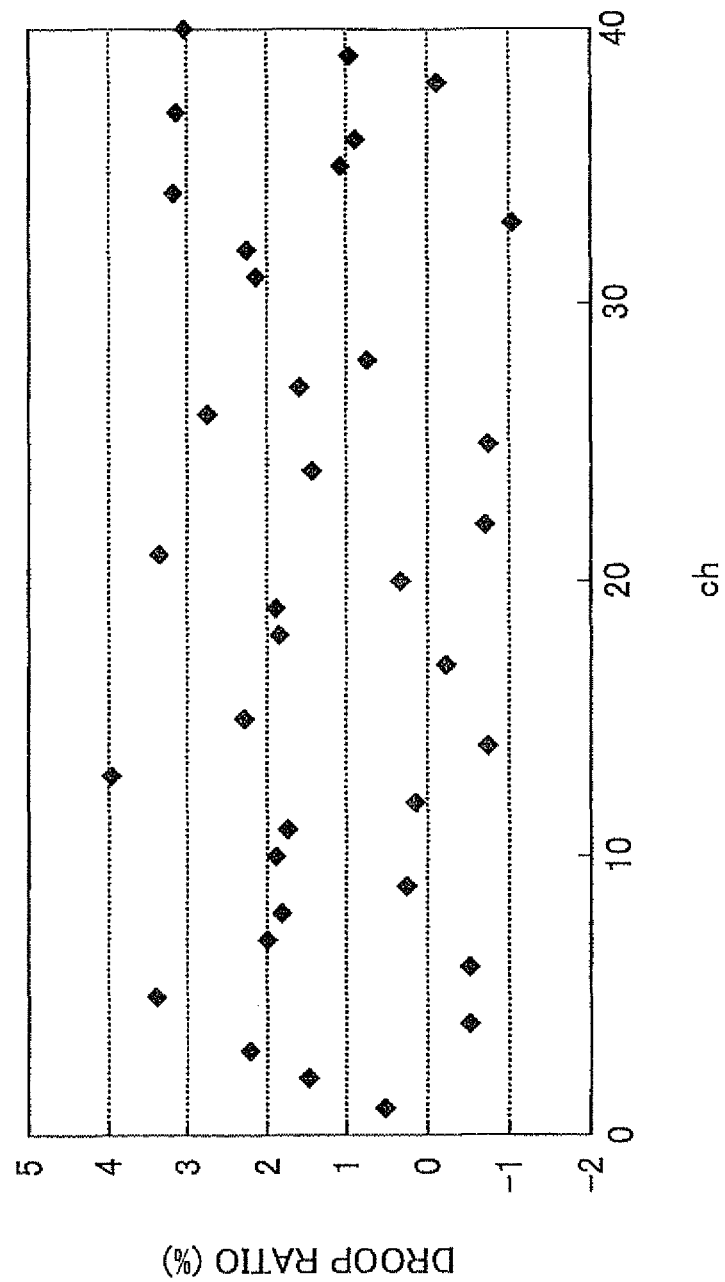
FIG. 32 is a graph illustrating the droop ratio of the light-emitting portions of an optical device according to the related art.

For example, an optical device A including a surface-emitting laser array of 40 light-emitting portions (ch1 through ch40) in accordance with the present embodiment of the present invention was prepared. For comparison, an optical device B similar to the conventional surface-emitting laser module, also including a surface-emitting laser array of 40 light emitting portions, was prepared. In these optical devices, the droop ratios of all of their 40 light-emitting portions were measured. The result of measurement of the optical device A is illustrated in FIG. 31, while the result for the optical device B is illustrated in FIG. 32. FIG. 31 (embodiment) shows that Dr (max)=2% and Dr(min)=0.5%, indicating a difference of 1.5%. On the other hand, FIG. 32 (comparative example) shows Dr(max)=4% and Dr(min)=−1%, indicating a difference of 5%. Thus, the optical device according to the present embodiment has greater resistance to feedback light, so that the development of abnormal waveforms is reduced, thereby controlling the light amount variation.

Thus, the optical device 510 according to the present embodiment includes the laser chip 100, the package member 200 that retains the laser chip 100, and the cover glass 300. The laser chip 100 is a surface-emitting laser array chip having a plurality of light-emitting portions. The cover glass 300 is disposed on the optical path of the light beam emitted by the laser chip 100. The cover glass 300 has an incident plane on which the light beam from the laser chip 100 is incident. The incident plane is inclined with respect to the emitting surface of the laser chip 100 at an inclination angle that is smaller than the inclination angle at which the light emitted by one of the light-emitting portions that is located on one end of the array is incident on the light emitting portion located on the other end (i.e., the two light emitting portions are spaced apart by the greatest distance on the array) after being reflected by the cover glass 300. In this case, stable light having reduced light amount variation can be emitted without increase in cost or size of the apparatus.

The light-emitting portion 160 has the mode filter 115 in a peripheral portion of the emission area. The mode filter 115 comprises a transparent dielectric film configured to reduce the reflectivity of the peripheral portion compared to the reflectivity of the central portion, so that a transverse mode control effect can be obtained. The mode filter 115 may include the first and the second mode filters 115A and 115B disposed opposite each other across the central region. The central region, which has a relatively high reflectivity, has shape anisotropy so that the polarization direction can be aligned.

Because the light-source unit 14 of the optical scanning apparatus 1010 has the optical device 510, a highly accurate optical scanning operation can be performed without increasing cost. Thus, the laser printer 1000 that includes the optical scanning apparatus 1010 can form a high-quality image.

In the laser chip 100, the light-emitting portions 160 are arranged at the regular interval d1 when viewed in an orthographic projection of all of the light emitting portions 160 on a virtual line extending in the sub-scan direction. Thus, by adjusting the timing of lighting of the light emitting portions, the same effect as if the light-emitting portions are arranged in the sub-scan direction at regular intervals can be obtained on the photosensitive drum 1030.

A high-density write operation of 4800 dpi (dots per inch) can be performed by, for example, setting the interval d1 at 2.65 µm and doubling the magnification factor of the optical system of the optical scanning apparatus 1010. It goes without saying that the write density can be further increased by increasing the number of the light-emitting portions in the main-scan direction, by further reducing the interval d1 by narrowing a pitch d2 in the sub-scan direction (see FIG. 10), or increasing the magnification factor of the optical system, thereby enabling higher quality printing. A write interval in the main-scan direction can be easily controlled via the timing of lighting of the light-emitting portions.

In this case, the laser printer 1000 can perform the printing operation without a decrease in printing speed even though the write dot density is increased. This means that the printing speed can be increased further for the same write dot density. Because the polarization direction of the light beams from the light-emitting portions is stable and aligned, the laser printer 1000 can form a high-quality image stably.

The number of the light-emitting portions 160 in the laser chip 100 is not limited to 32. The material of the protection layer 111 is not limited to SiN and may include $SiN_x$, $SiO_x$, $TiO_x$, or SiON. By adjusting the film thickness depending on the refractive index of the material, the same effect as that of the foregoing embodiment can be obtained.

While in accordance with the foregoing embodiment the first and second small regions (M1, M2) are disposed symmetrically with respect to an axis that passes through the center of the emission area and that is parallel to the Y axis, this is merely an example. In another embodiment, the first small region M1 may be disposed on one end and the second small region M2 may be disposed on the other end of the axis passing through the center of the emission area and parallel to the Y axis.

While in the foregoing embodiment, the first and the second mode filters 115A and 115B are made of the same material as that of the protection layer 111, this is merely an example. Further, the shape of the first and the second mode filters 115A and 115B is not limited to the rectangular shape according to the foregoing embodiment and may include a semicircle, for example.

While in the foregoing embodiment the mode filter 115 is composed of the two dielectric film portions (first and second mode filters 115A and 115B), this is merely an example. In another embodiment, the mode filter may include a single ring-shaped dielectric film portion surrounding the central portion of the emission area. The optical thickness of the first and the second mode filters 115A and 115B is not limited to $\lambda/4$. In another example, the optical thickness may be $3\lambda/4$. Namely, the same transverse mode control effect as that of the laser chip 100 according to the foregoing embodiment can be obtained as long as the optical thickness of the first and the second mode filters 115A and 115B is an odd multiple of $\lambda/4$.

The central portion of the emission area may be covered with a dielectric film with an optical thickness of an even multiple of $\lambda/4$. In this case, the same optical characteristics as when there was no such dielectric film can be obtained without a decrease in the reflectivity of the central portion. The areas within the emission area other than the area of the mode filter may be covered with a dielectric film having an optical thickness of an even multiple of $\lambda/4$, so that the entire emission area is coated with a dielectric film. In this way, oxidation or contamination of the emission area can be prevented. Thus, the same transverse mode control effect can be obtained when the optical thickness of the portion where reflectivity is desired to be reduced is an odd multiple of $\lambda/4$ and the optical thickness of the other portions is an even multiple of $\lambda/4$.

Figure 33:
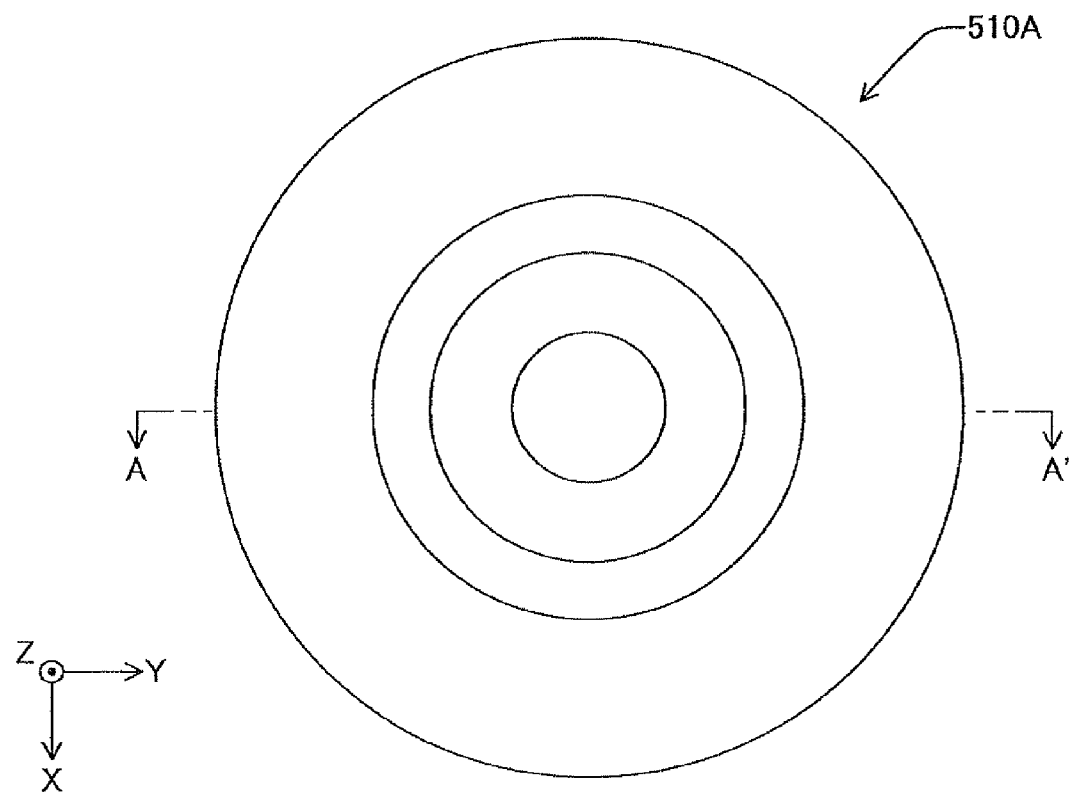
FIG. 33 illustrates an optical device according to another embodiment of the present invention.
Figure 34:
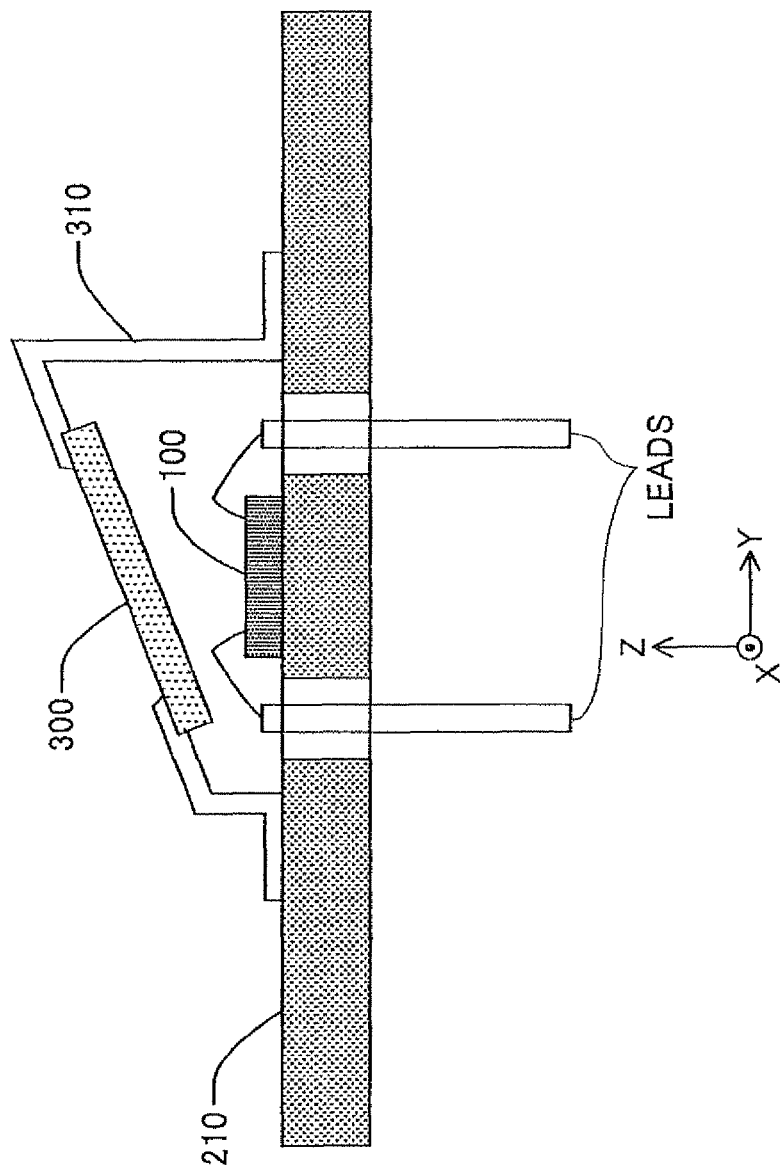
FIG. 34 is a cross section taken along line A-A' of FIG. 33.

FIG. 33 is a plan view of an optical device 510A which is a variation of the optical device 510 of the foregoing embodiment. FIG. 34 is a cross section taken along line A-A' of FIG. 33. The optical device 510A includes the laser chip 100 mounted on a metal stem 210. The cover glass 300 is attached to the cap 310 at the same inclination angle as that of the optical device 510, and the cap 310 is welded to the stem 210. The optical device 510A can also provide the same effect as that of the optical device 510.

Figure 35:
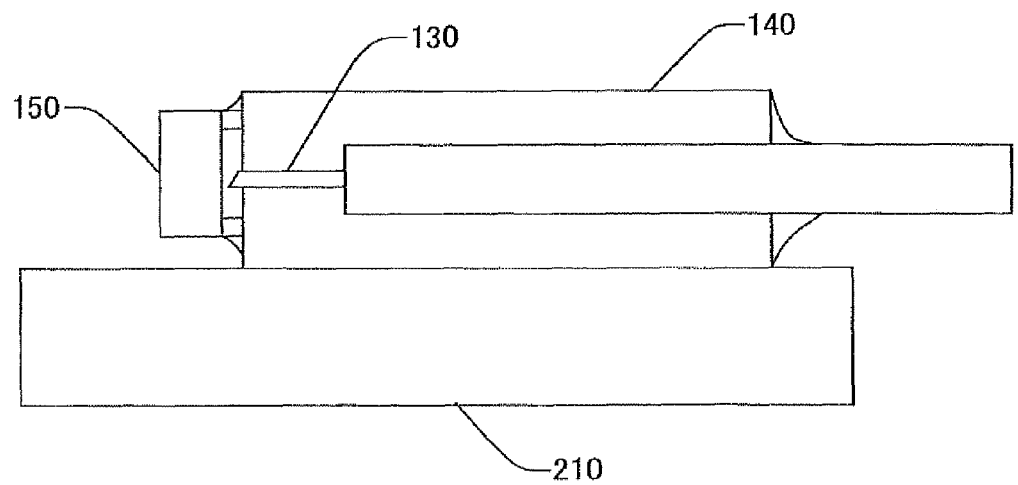
FIG. 35 illustrates an optical device 510C according to an embodiment of the present invention for optical communications.

The concept of the optical device 510 may be applied for optical communication purposes. FIG. 35 illustrates an optical device 510C that includes a substrate 210 on which an OE (optoelectronic) ferrule 140 made of a resin material is disposed. On one end of the OE ferrule 140, a surface-emitting laser element 150 is mounted by flip-chip technology. An optical fiber 130 with a tapered front end face is fixedly attached in front of the surface-emitting laser element 150.

The shift amount $\Delta\lambda$ of the resonant wavelength may be set to 2.4 nm based on the above principle when the resonant wavelength $\lambda$ of the surface-emitting laser element is 780 nm, the refractive index n of the resonator is 3.3156, the resonator reflectivity R is 0.998, and the resonator length d is 235.25 nm. In this case, the critical incident angle $\Psi_0$ is 15°. Thus, the front end face of the optical fiber is processed such that the end face has a tapered angle $\phi$ of 16° with respect to the plane of the surface-emitting laser element. Thus, the influence of feedback light from the optical fiber end on the surface-emitting laser element can be reduced, so that good optical transmission characteristics can be obtained in the coupling between the optical fiber and the surface emitting laser element.

Figure 36:
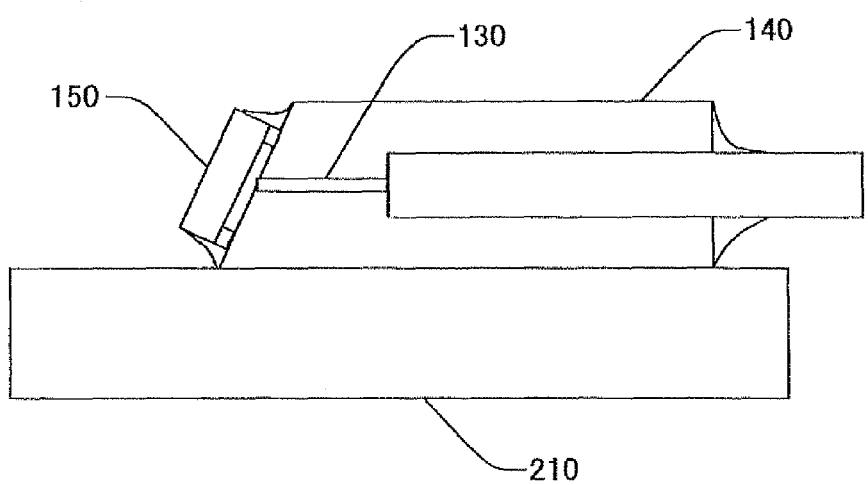
FIG. 36 illustrates an optical device 510D according to another embodiment of the present invention for optical communication.

FIG. 36 illustrates an optical device 510D according to another embodiment of the present invention. The optical device 510D also includes a substrate 210 on which an OE ferrule 140 made of a resin material is disposed. In the present embodiment, one end of the ferrule 140 is tapered at an angle $\phi$ with respect to the end face of the optical fiber 130. A surface-emitting laser element 150 is mounted on the tapered surface of the ferrule 140 by flip-chip technology. The optical fiber 130 is fixedly mounted in front of the surface-emitting laser element 150.

When the resonant wavelength $\lambda$ of the surface-emitting laser element is 780 nm, the refractive index n of the resonator is 3.3156, the resonator reflectivity R is 0.998, and the resonator length d is 235.25 nm, the shift amount $\Delta\lambda$ of the resonant wavelength may be set to 2.4 nm based on the above-described principle, obtaining the critical incident angle $\Psi_0$ of 15°. Thus, the end of the ferrule 140 to which the surface-emitting laser element is mounted is processed to have a tapered angle $\phi$ of 16°. In this way, the influence of feedback light from the optical fiber end on the surface-emitting laser element can be reduced, so that good optical transmission characteristics can be achieved in the coupling between the optical fiber and the surface-emitting laser element.

Figure 37A:
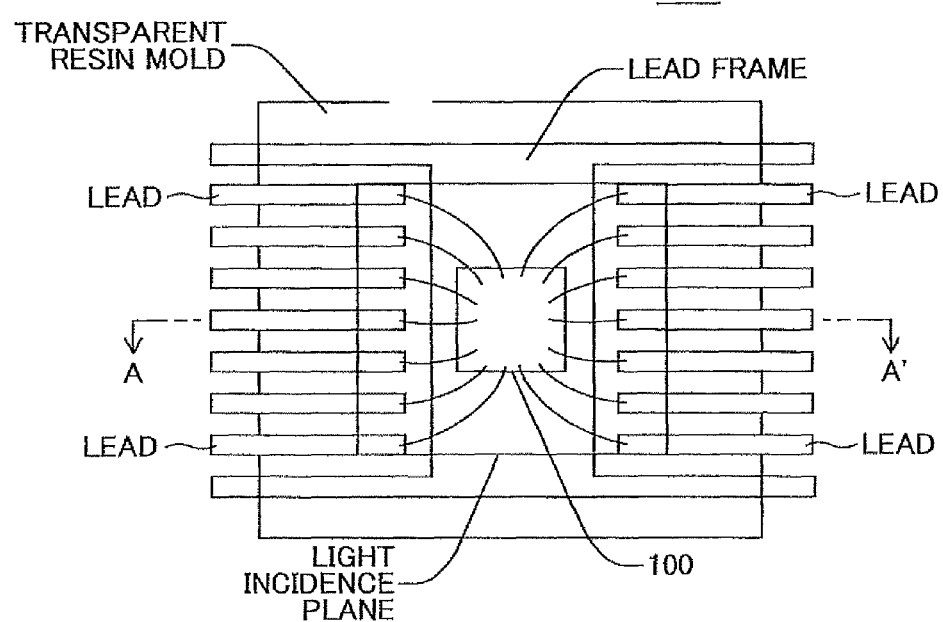
FIG. 37A is a plan view of an optical device 510F according to another embodiment of the present invention.
Figure 37B:
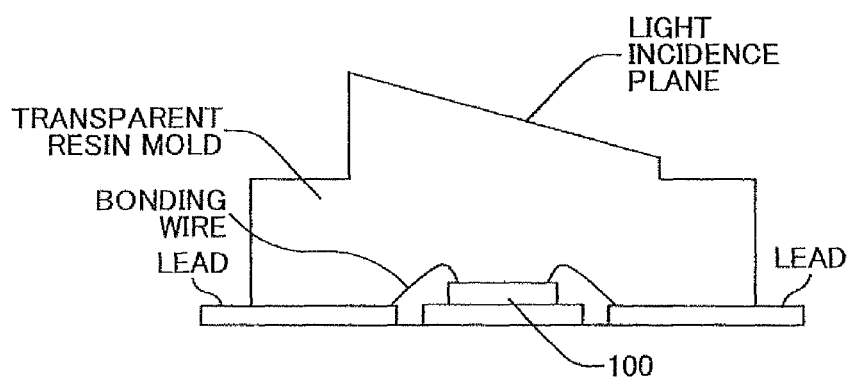
FIG. 37B is a cross section taken along line A-A' of FIG. 37A.

FIG. 37A is a plan view of an optical device 510F that can be manufactured at lower cost than the optical device 510A. FIG. 37B is a cross section taken along line A-A' of FIG. 37A. The optical device 510F includes a lead frame on which a surface-emitting laser array 100 is mounted. The surface-emitting laser array 100 is covered by a transparent resin such that the surface-emitting laser array 100 is contained within a transparent resin mold member. The resin mold member has a light incident plane that is inclined at a predetermined angle with respect to the emitting surface of the surface-emitting laser array 100, as in the case of the optical device 500. In accordance with the present embodiment, the need for the metal cap with the cover glass and the welding step during manufacture can be eliminated, thus lowering cost.

A method of manufacturing the optical device 510F is briefly described.

(a) The surface-emitting laser array 100 is mounted at a central portion of the lead frame using electrically conductive adhesive.

(b) The light-emitting portions are connected to corresponding leads by bonding wire.

(c) Powder or liquid epoxy resin is poured under pressure into a mold and thermally cured by a casting or transfer-mold method. The mold is designed such that the light incident plane is formed at a predetermined angle.

In this way, the optical device 510F can be manufactured at low cost.

The optical scanning apparatus 1010 may be used in an image forming apparatus other than a printer as in the foregoing embodiments, such as a copy machine, a facsimile machine, or a multifunction peripheral combining multiple image forming or processing functions. The laser printer 1000 is merely an example of an image forming apparatus. The image forming apparatus may be of a type in which an image is directly formed on an image carrier. For example, an embodiment of the present invention may be applied for CTP (Computer to Plate) imaging technology. Specifically, an image forming apparatus having an optical scanning apparatus including the optical device 510 may be configured to form an image directly onto a printing plate as an image carrier by laser abrasion.

The image forming apparatus according to an embodiment of the present invention may irradiate laser light onto a print medium (such as a sheet print medium) that is configured to develop a color in a reversible manner. Such a print medium includes a rewritable paper comprising a support, which may be a sheet of paper or film of a resin material, onto which a recording layer material is applied. The recording layer material is configured to develop or lose color depending on the thermal energy of the irradiating laser light, thus enabling the control of appearance or disappearance of a displayed color.

Such rewritable technology includes a transparent/opaque type rewritable marking method and a coloring/discoloring type rewritable marking method using leuco dye. The present invention may be applied to both. The transparent/opaque type employs a polymer thin film in which fine particles of fatty acid are dispersed. When the polymer thin film is heated to 110° C. or above, the fatty acid melts and the resin expands. Upon cooling, the fatty acid is placed in a supercooled state such that the fatty acid remains in liquid form while the expanded resin is solidified. Thereafter, the fatty acid is solidified and contracted into polycrystalline fine particles, leaving gaps between the resin and the fine particles. The gaps scatter light, appearing white. When the polymer thin film is heated to an erasing temperature range between 80° C. and 110° C., some of the fatty acid melts such that the resin is thermally expanded, thus filling the gaps. Upon cooling with the gaps gone, the film appears transparent; i.e., an image can be erased.

On the other hand, the rewritable marking method using leuco dye is based on a reversible coloring reaction between a colorless leuco dye and a developer having a long-chain alkyl group. When heated by laser light, the leuco dye and the developer react to each other to produce a color. Upon rapid cooling, the colored state is preserved. Upon slow cooling after heating, a phase separation occurs due to autoagglutination of the developer, by which the leuco dye and the developer are separated from each other, thus losing the color.

The recording medium may also include a so-called color rewritable paper that comprises a support, such as a sheet of paper or a resin film, on which photochromic compounds are provided. The photochromic compounds may include a photochromic compound that appears cyan (C) upon irradiation with ultraviolet light where the color disappears upon irradiation with the visible light of red (R); a photochromic compound that appears magenta (M) upon irradiation with ultraviolet light where the color M disappears upon irradiation with the visible light of green (G); and a photochromic compound that appears yellow (Y) upon irradiation with ultraviolet light where the color disappears upon irradiation with the visible light of blue (B).

Such a color rewritable paper may be caused to appear black upon irradiation with ultraviolet light, develop full colors by controlling the color density of the three kinds of material for developing Y, M, and C by adjusting the duration of time or intensity of irradiation of the R, G, or B light, and then appear white by irradiating strong R, G, and B lights for a required period of time.

The image carrier may include a film of silver halide photosensitive material. In this case, a latent image formed on the silver halide photosensitive film by optical scanning may be developed into a visible image by a process similar to the conventional silver halide photography process. The developed image may then be transferred onto a printing paper in a process similar to the conventional printing process according to silver halide photography. Such an image forming apparatus may be used as a optical print making apparatus or an optical image-drawing apparatus configured to draw a CT scan image or the like.

Figure 38:
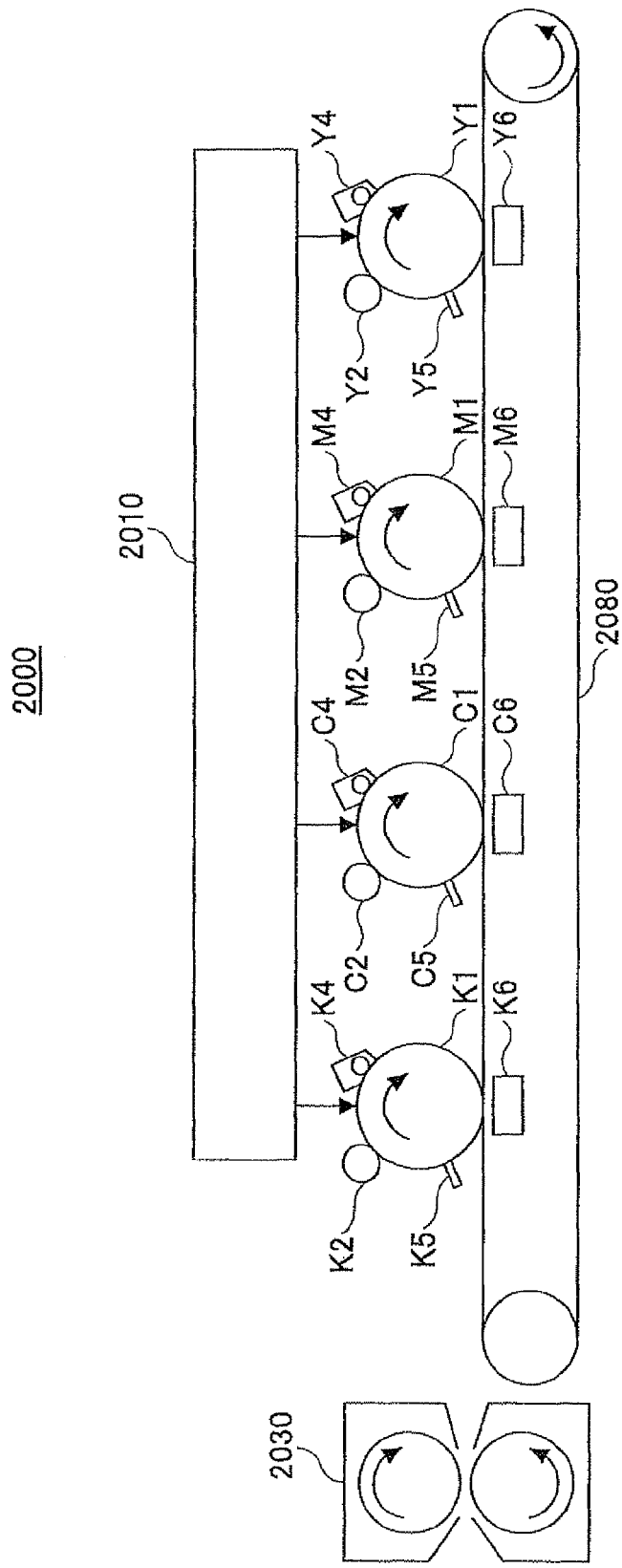
FIG. 38 illustrates a color printer according to an embodiment of the present invention.

FIG. 38 illustrates a color printer 2000 having a plurality of photosensitive drums according to an embodiment of the present invention. The color printer 2000 is of a tandem-type configured to form a full color image by superposing four colors of black, cyan, magenta, and yellow on a recording medium such as a recording paper. Thus, the color printer 2000 includes photosensitive drums K1, a charging unit K2, a developing unit K4, a cleaning unit K5, and a transfer unit K6 for black (K); a photosensitive drum C1, a charging unit C2, a developing unit C4, a cleaning unit C5, and a transfer unit C6 for cyan (C); a photosensitive drum M1, a charging unit M2, a developing unit M4, a cleaning unit M5, and a transfer unit M6 for magenta (M); and a photosensitive drum Y1, a charging unit Y2, a developing unit Y4, a cleaning unit Y5, and a transfer unit Y6 for yellow (Y). The color printer 2000 also includes an optical scanning apparatus 2010, a transport belt 2080, and a fusing unit 2030. Any of the photosensitive drums for the various colors may be referred to as "the photosensitive drum". Similarly, any of the charging units, the developing units, the cleaning units, and the transfer units for the various colors may be referred to as "the charging unit", "the developing unit", "the cleaning unit", and "the transfer unit", respectively.

The photosensitive drum is rotated in a direction indicated by an arrow shown on the photosensitive drum in FIG. 38. The charging unit, the developing unit, the transfer unit, and the cleaning unit are disposed around the photosensitive drum. The charging unit is configured to uniformly charge a surface of the photosensitive drum. The charged surface of the photosensitive drum is irradiated with light emitted by the optical scanning apparatus 2010 in order to form a latent image on the photosensitive drum surface. The developing unit attaches toner of the corresponding color to the photosensitive drum surface, thus forming a toner image of the corresponding color. The toner images of the various colors are then transferred by the corresponding transfer units onto a recording sheet transported by the transport belt 2080. The transferred image is then fused onto the recording sheet by the fusing unit 2030.

The optical scanning apparatus 2010 includes the optical devices 510 for the respective colors. Thus, the optical scanning apparatus 2010 can provide the same effect as that provided by the optical scanning apparatus 1010. Because of the optical scanning apparatus 2010, the color printer 2000 can provide the same effect as that by the laser printer 1000. In the color printer 2000, a color registration error due to manufacturing error or position error in the various components of the apparatus can be reduced or eliminated by properly selecting the light-emitting portions that are activated.

Thus, the optical device according to an embodiment of the present invention is small in size and can emit light stably and with little light amount variation at low cost. An optical scanning apparatus according to an embodiment of the present invention may be suitably used for a high-precision optical scanning operation at low cost. An image forming apparatus according to an embodiment of the present invention can be suitably used for forming a high-quality image.

Although this invention has been described in detail with reference to certain embodiments, variations and modifications exist within the scope and spirit of the invention as described and defined in the following claims.

The present application is based on Japanese Priority Applications No. 2009-288626 filed Dec. 21, 2009 and No. 2010-240266 filed Oct. 27, 2010, the entire contents of which are hereby incorporated by reference.

The invention claimed is:

1. An optical device comprising:
a surface-emitting laser array having a plurality of light-emitting portions;
a package member on which the surface-emitting laser array is disposed; and
a transparent member retained on the package member and disposed on an optical path of a light beam emitted by the surface-emitting laser array,
the transparent member including an incident plane on which the light beam emitted by the surface-emitting laser array is incident, each light-emitting portion amongst the plurality of light-emitting portions including an upper reflector layer and a lower reflector layer, a combination of the upper reflector layer and lower reflector layer of the light-emitting portion defining a resonator, wherein light reflected back from the transparent member is incident upon an upper surface of the resonator, wherein the incident plane of the transparent member is inclined with respect to an emitting surface of the surface-emitting laser array at a first inclination angle which is smaller than or equal to a second inclination angle at which the light emitted by one of the light-emitting portions is incident on another of the light-emitting portions via reflection by the transparent member, wherein the one of the light emitting portions and said another of the light emitting portions are spaced apart from each other by the greatest distance among the light emitting portions of the surface-emitting laser array, and wherein the first inclination angle of the transparent member is set such that total reflectivity of the feedback light incident on the resonator of said another of the light emitting portions is at least 99% of the incident light.

2. The optical device according to claim 1, wherein each of the light-emitting portions of the surface-emitting laser array includes a cavity structure having an active layer, wherein the first inclination angle of the incident plane with respect to the emitting surface is equal to or more than $(\theta_{LD}+\Psi_0)/2$, where $\theta_{LD}$ is a beam spreading angle corresponding to $2\sigma$ or more of a far-field pattern of the emitted light, and $\Psi_0$ is a critical incident angle such that the reflectivity of the cavity structure with respect to the light of a resonant wavelength which is determined by the refractive index of the cavity structure and its length is 99% or more when the light reflected by the transparent member is incident on the cavity structure.

3. The optical device according to claim 2, wherein the beam spreading angle $\theta_{LD}$ corresponds to $3\sigma$ or more of the far-field pattern.

4. The optical device according to claim 2, wherein the resonant wavelength with respect to the light incident on the cavity structure at the critical incident angle $\Psi_0$ is shorter than the resonant wavelength determined by the refractive index of the cavity structure and its length by 2 nm or more.

5. The optical device according to claim 1, wherein each of the light-emitting portions of the surface-emitting laser array includes an emission area, wherein the emission area includes a lower-reflectivity region covered with a transparent dielectric film.

6. The optical device according to claim 5, wherein the emission area includes a higher-reflectivity region having a reflectivity higher than the reflectivity of the lower-reflectivity region, wherein the higher-reflectivity region has shape anisotropy when viewed from a direction in which the light is emitted from the optical device.

7. The optical device according to claim 1, wherein the transparent member includes a transparent resin molded member, wherein the surface-emitting laser array is contained within the transparent resin molded member.

8. The optical device according to claim 1, wherein the transparent member includes an optical fiber.

9. The optical device according to claim 8, wherein the optical fiber includes an end face whose plane is perpendicular to a longitudinal direction of the optical fiber, wherein a normal to the emitting surface of the surface-emitting laser element is inclined with respect to the longitudinal direction of the optical fiber.

10. The optical device according to claim 8, wherein the optical fiber includes an end face which is inclined with respect to a longitudinal direction of the optical fiber, wherein a normal to the emitting surface of the surface-emitting laser element is parallel to the longitudinal direction of the optical fiber.

11. An optical scanning apparatus comprising:

a light source including the optical device according to claim 1;

a deflector configured to deflect the light emitted by the light source; and a scanning optical system configured to collect the light deflected by the deflector on a scanned surface.

12. An image forming apparatus comprising:

an image carrier; and the optical scanning apparatus according to claim 11 configured to scan the image carrier with light having image information.

13. The image forming apparatus according to claim 12, wherein the image information includes multiple-color image information.

14. The optical device according to claim 1, wherein the one light-emitting portion is disposed at one end of the surface-emitting laser array, and the other light-emitting portion is disposed at an opposite end of the surface-emitting laser array.

* * * * *